United States Patent
Shen et al.

(10) Patent No.: US 12,504,654 B2
(45) Date of Patent: Dec. 23, 2025

(54) PHOTONIC SEMICONDUCTOR-INSULATOR-SEMICONDUCTOR MODULATOR AND METHODS FOR FORMING THE SAME

(71) Applicant: Taiwan Semiconductor Manufacturing Company Limited, Hsinchu (TW)

(72) Inventors: Tien-Lin Shen, Taipei (TW); Ming Lee, Taipei (TW); Wei-Heng Lin, Taipei (TW); Hsing-Kuo Hsia, Jhubei (TW); Chen-Hua Yu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 205 days.

(21) Appl. No.: 18/478,890

(22) Filed: Sep. 29, 2023

(65) Prior Publication Data
US 2025/0110360 A1 Apr. 3, 2025

(51) Int. Cl.
G02F 1/025 (2006.01)
(52) U.S. Cl.
CPC .................. G02F 1/025 (2013.01)
(58) Field of Classification Search
CPC ........ G02F 1/025; G02F 1/0152; G02F 1/015; G02F 1/0155; G02F 1/0157
See application file for complete search history.

(56) References Cited

U.S. PATENT DOCUMENTS

| | | | |
|---|---|---|---|
| 10,705,354 B2* | 7/2020 | Menezo | G02F 1/025 |
| 10,795,189 B2* | 10/2020 | Monfray | G02F 1/025 |
| 2008/0298747 A1 | 12/2008 | Khan et al. | |

FOREIGN PATENT DOCUMENTS

| | | |
|---|---|---|
| CN | 106098509 A | 11/2016 |
| CN | 114966961 A | 8/2022 |
| TW | 201346365 A | 11/2013 |

OTHER PUBLICATIONS

TW Patent and Trademark Office; TW Application No. 112141891; Notice of Allowance mailed Mar. 13, 2025; 8 pages.

* cited by examiner

*Primary Examiner* — John Bedtelyon
(74) *Attorney, Agent, or Firm* — The Marbury Law Group, PLLC

(57) ABSTRACT

An embodiment photonic device may include a first terminal including silicon and a second terminal including polysilicon. The first terminal may be configured as a first three-dimensional structure extending along a first direction and having a first U-shaped portion in a first cross-sectional plane perpendicular to the first direction. Similarly, the second terminal may be configured as a second three-dimensional structure extending along the first direction and having a second U-shaped portion in the first cross-sectional plane. The photonic device may further include a capacitor dielectric layer disposed between the first terminal and the second terminal and a cladding dielectric layer surrounding the first terminal and the second terminal. The first U-shaped portion and the second U-shaped portion may be arranged in an interlocking configuration having an overlapping region that is configured as an optical transmission line in which the first direction is an optical propagation direction.

20 Claims, 35 Drawing Sheets

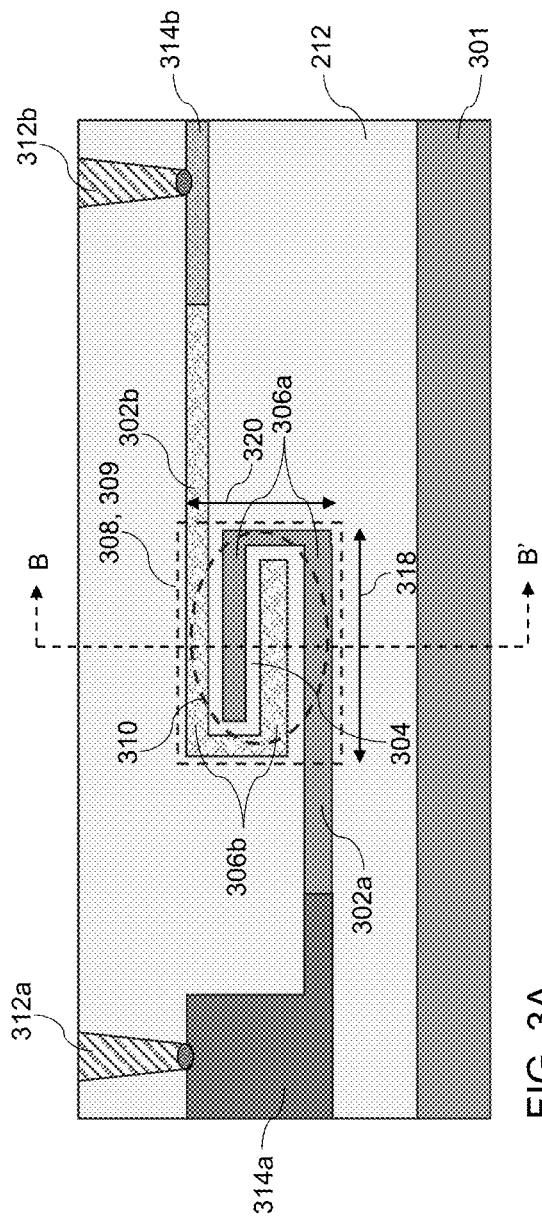
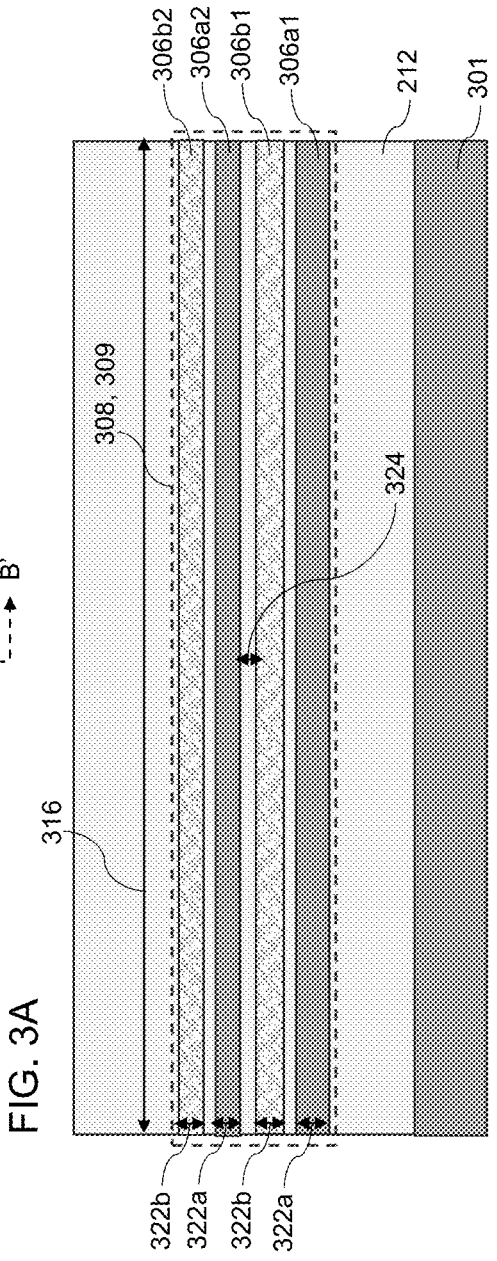
FIG. 3A
FIG. 3B

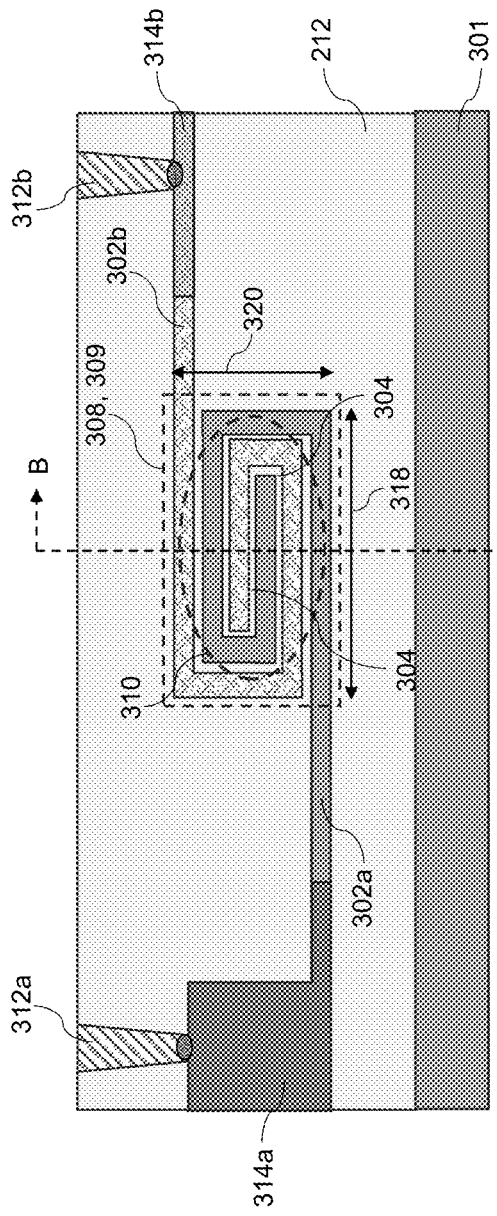
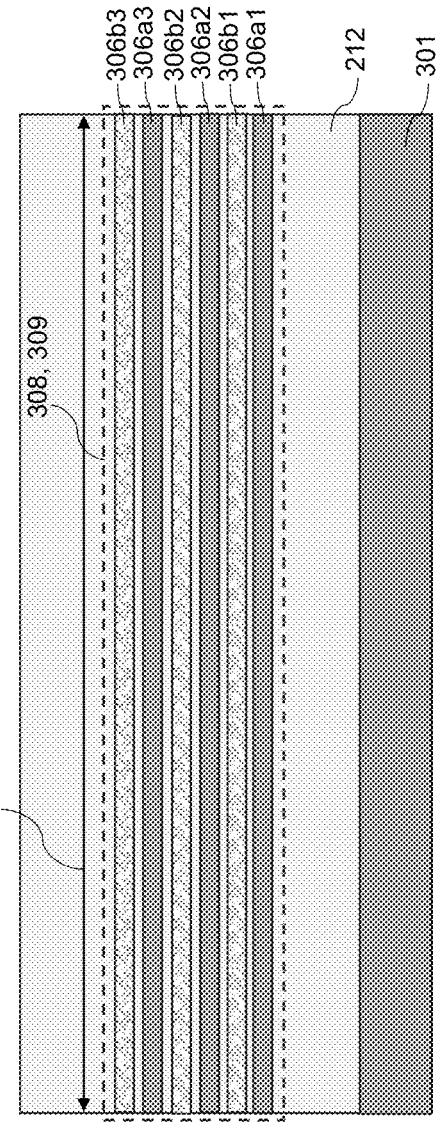
FIG. 4A
FIG. 4B

PHOTONIC SEMICONDUCTOR-INSULATOR-SEMICONDUCTOR MODULATOR AND METHODS FOR FORMING THE SAME

BACKGROUND

Many computing applications use optical signals for secure high-speed data transmission. Various emerging technologies are also being developed that may provide functionality to perform computing operations directly on optical signals. Silicon photonics is a promising technology area that uses semiconductor device processing techniques to provide systems including integrated electronic and photonic components. Such components may be used for the generation, routing, modulation, processing, and detection of light. Together, these functions form an optical analog to electronic integrated circuits (IC) and, as such, may constitute photonic integrated circuits (PIC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a vertical cross-sectional view of a photonic device having an optical transmission line, according to various embodiments.

FIG. 3B is a further vertical cross-sectional view of the photonic device of FIG. 3A, according to various embodiments.

FIG. 4A is a vertical cross-sectional view of a further photonic device having an optical transmission line, according to various embodiments.

FIG. 4B is a further vertical cross-sectional view of the photonic device of FIG. 4A, according to various embodiments.

DETAILED DESCRIPTION

Figure 1:
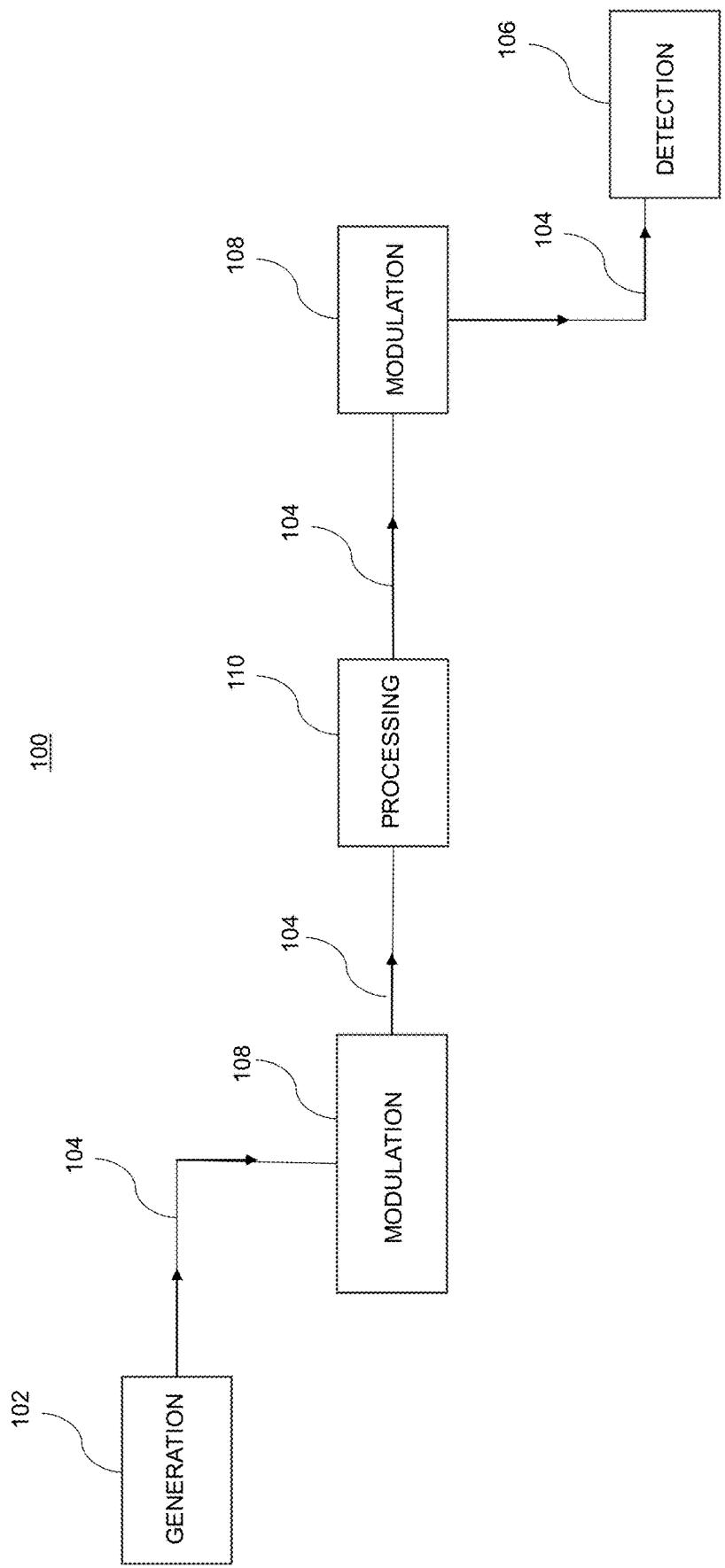
FIG. 1 is a schematic illustration of various components that may be used in a photonic computing system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Optical phase and amplitude modulators play an important role in photonic computing systems. An electro-optic modulator is a device that has optical properties (e.g., index of refraction and absorption coefficient) that may be varied as a function of an applied electrical potential. Such electro-optic modulators may be used to convert an electrical signal, applied to the modulator, into an optical signal in which data may be encoded based on the time dependent modulations of the optical signal. Various embodiments disclosed herein may provide advantages over related modulators by generating larger optical phase shifts for a given applied voltage than capable with related modulators. Further, various embodiments disclosed herein may provide smaller devices with reduced optical insertion loss relative to other related modulators. In this regard, various embodiment optical modulators may include a first terminal and second terminal having an interlocking configuration that includes a stacked structure including alternating connected layers of the first terminal and the second terminal. The stacked structure may improve modulation efficiency due to an increased overlap of an optical mode electric field with charge carriers of the first terminal and the second terminal leading to sub-1V phase modulation.

An embodiment photonic device may include a first terminal formed of silicon and a second terminal formed of polysilicon. The first terminal may be configured as a first three-dimensional structure extending along a first direction and having a first U-shaped portion in a first cross-sectional plane perpendicular to the first direction. Similarly, the second terminal may be configured as a second three-dimensional structure extending along the first direction and having a second U-shaped portion in the first cross-sectional plane. The photonic device may further include a capacitor dielectric layer disposed between the first terminal and the second terminal and a cladding dielectric layer surrounding the first terminal and the second terminal. The first U-shaped portion and the second U-shaped portion may be arranged in an interlocking configuration having an overlapping region that is configured as an optical transmission line in which the first direction is an optical propagation direction.

According to a further embodiment, a photonic device may include a first terminal having a p-type semiconductor and a second terminal having an n-type semiconductor. The first terminal may be configured as a first three-dimensional structure extending along a first direction and having a first overlapping portion in a first cross-sectional plane perpendicular to the first direction, and the second terminal may be configured as a second three-dimensional structure extending along the first direction and having a second overlapping portion in the first cross-sectional plane perpendicular to the first direction. The photonic device may further include a capacitor dielectric layer disposed between the first terminal and the second terminal and a cladding dielectric layer surrounding the first terminal and the second terminal.

The first overlapping portion and the second overlapping portion may be arranged in an interlocking configuration having an overlapping region such that, in the overlapping region, the first terminal and the second terminal are further overlapping in a second cross-sectional plane that is perpendicular to the first cross-sectional plane. Further, each of the first overlapping portion and the second overlapping portion may be folded an integer number (m) of times such that the overlapping region includes an alternating stack of m+1 first folded segments of the first terminal and m+1 second folded segments of the second terminal, wherein m is greater than or equal to 1. The overlapping region may be configured as an optical transmission line in which the first direction is an optical propagation direction.

An embodiment method of forming a photonic device may include depositing, over a substrate, alternating layers of a first-conductivity-type semiconductor and a second-conductivity-type semiconductor along with capacitor dielectric layers separating adjacent alternating layers. The method may further include performing an etching operation sequentially, upon completion of a deposition process for each of the alternating layers, to reduce a width of each of the alternating layers. The method may further include forming, for each subsequent layer of a given conductivity-type semiconductor, a vertical edge portion of the given conductivity-type semiconductor that connects the subsequent layer with a previously deposited layer of the given conductivity-type semiconductor.

The method may further include forming the plurality of connected first-conductivity-type semiconductor layers to thereby form a first terminal having a first overlapping portion in a first cross-sectional plane perpendicular to a first direction. Similarly, the method may include forming the plurality of connected second-conductivity-type semiconductor layers to thereby form a second terminal having a second overlapping portion in the first cross-sectional plane. The method may further include configuring the first overlapping portion and the second overlapping portion to be arranged in an interlocking configuration having an overlapping region such that, in the overlapping region, the first terminal and the second terminal are further overlapping in a second cross-sectional plane that is perpendicular to the first cross-sectional plane.

FIG. 1 is a schematic illustration of an integrated photonic computing system 100, according to various embodiments. System components may include a generation device also referred to as a photonic source 102 such as a laser or light-emitting diode (LED), a routing device that may include a plurality of waveguides 104 configured to route optical signals, and a detector that includes one or more optical detectors 106 configured to detect optical signals and to convert received optical signals into output electrical signals. Additional components may include a modulation device that includes one or more optical modulators 108 and photonic processing components 110. The photonic processing components 110 may be configured to perform logic operations on a modulated optical signal provided by the optical modulator 108. The one or more optical modulators 108 may be configured to impose an amplitude and/or phase modulation on an input optical signal generated by the photonic source 102. As described in greater detail with reference to FIGS. 3A and 3B, below, an embodiment photonic device 300 may be used in the integrated photonic system 100 as an improved optical modulator 108.

The one or more optical modulators 108 may take an input electronic signal and modulate the input optical signal to impose the amplitude and/or phase modulation in response to the input electronic signal. In this way, the one or more optical modulators 108 may be used to convert data provided in the form of an electronic signal into data encoded as a photonic signal. Similarly, the one or more optical detectors 106 may convert processed photonic signals back into output electrical signals.

Figure 2A:
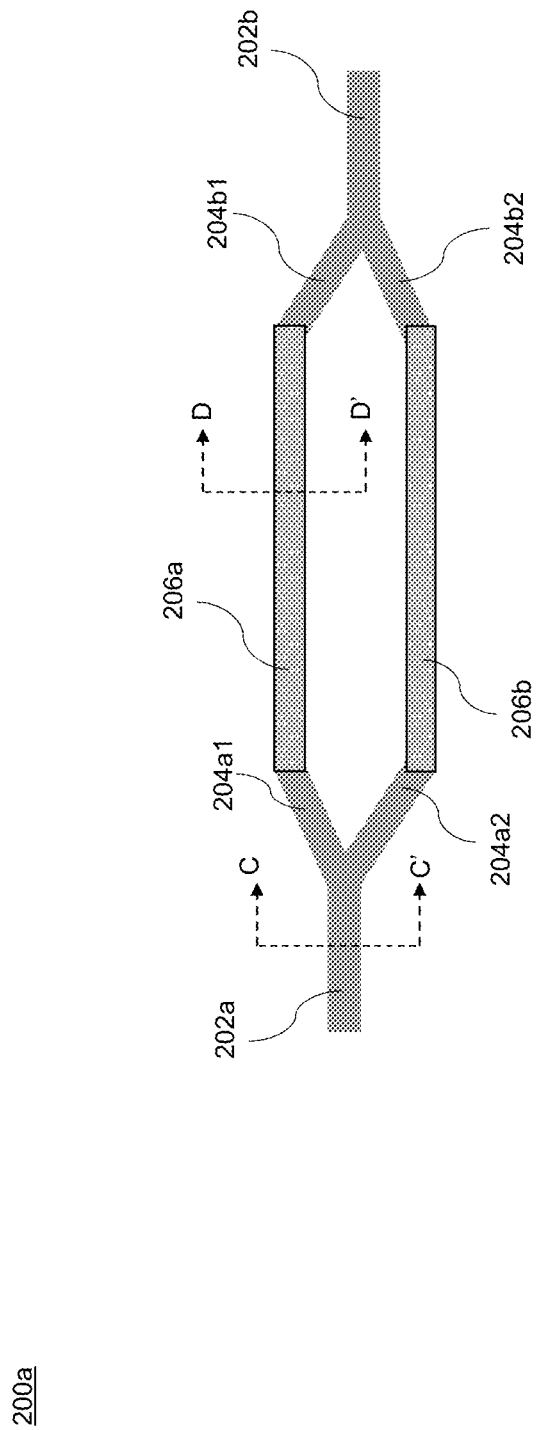
FIG. 2A is a top view of an electro-optic modulator that may be used in a photonic computing system.

FIG. 2A is a top view of an electro-optic modulator 200a that may be used in a photonic computing system. The cross-section C-C' indicates a vertical plane defining the vertical cross-sectional view shown in FIG. 2C and the cross-section D-D' indicates a vertical plane defining the vertical cross-sectional view of FIG. 2D. The electro-optic modulator 200a may include an input waveguide 202a and an output waveguide 202b. The input waveguide 202a may be configured to receive an input optical signal and the output waveguide 202b may be configured to provide an output signal that is a modulated version of the input optical signal. As shown, the input waveguide 202a may branch into a first waveguide segment 204a1 and a second waveguide segment 204a2. As such, the input waveguide 202a, the first waveguide segment 204a1, and the second waveguide segment 204a2 may act as a beam splitter.

An input signal received by the input waveguide 202a may be split into two optical signals (i.e., two copies of the input optical signal) that may be carried by the first waveguide segment 204a1 and the second waveguide segment 204a2, respectively. A first optical signal carried by the first waveguide segment 204a1 may be provided to a first modulator portion 206a and a second optical signal carried by the second waveguide segment 204a2 may be provided to a second modulator portion 206b. The first modulator portion 206a and the second modulator portion 206b may modify an amplitude and/or a phase of the respective first optical signal and the second optical signal.

The modified first optical signal transmitted along a third waveguide segment 204b1 and the modified second optical signal transmitted along a fourth waveguide segment 204b2 may then be combined to form an output optical signal that is provided to the output waveguide 202b. In this regard, the third waveguide segment 204b1 may be optically coupled to the first modulator portion 206a and the fourth waveguide segment 204b2 may be optically coupled to the second modulator portion 206b. In turn, the third waveguide segment 204b1 and the fourth waveguide segment 204b2 may be optically coupled to the output waveguide 202b. As such, the third waveguide segment 204b1, the fourth waveguide segment 204b2, and the second waveguide 202b may act as a beam combiner. The first modulator portion 206a and the second modulator portion 206b may each modulate the respective first optical signal and the second optical signal according to an electro-optic effect. In this regard, the first modulator portion 206a and the second modulator portion 206b may each include a material having electro-optic properties. Such an electro-optic material may have optical properties (e.g., index of refraction and absorption coefficient) that may vary as a function of an applied electrical bias (i.e., voltage difference).

Figure 2B:
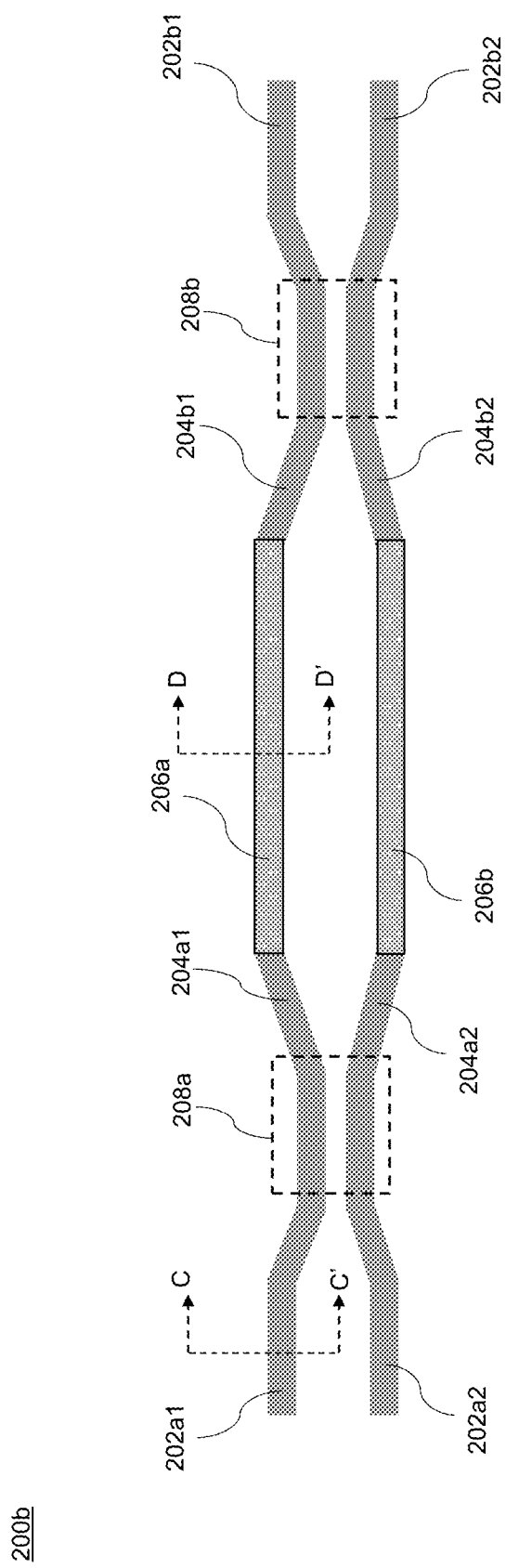
FIG. 2B is a top view of an optical switch that may be used in a photonic computing system.

FIG. 2B is a top view of an optical switch 200b that may be used in a photonic computing system. The cross-section C-C' indicates a vertical plane defining the vertical cross-sectional view shown in FIG. 2C and the cross-section D-D' indicates a vertical plane defining the vertical cross-sectional view of FIG. 2D. The optical switch 200b may include a first input waveguide 202a1, a second input waveguide 202a2, a first output waveguide 202b1, and a second output waveguide 202b2. Each of the first input waveguide 202a1, the second input waveguide 202a2, the first output waveguide 202b1, and the second output waveguide 202b2 may be configured to support single mode or multimode optical beams carrying optical signals. In an example embodiment, the optical switch 200b may be implemented as a Mach-Zehnder interferometer integrated with a first 50/50 beam splitter 208a and a second 50/50 beam splitter 208b. As shown in FIG. 2B, each of the first input waveguide 202a1 and the second input waveguide 202a2 may be optically coupled to the first 50/50 beam splitter 208a (also referred to as a directional coupler). The first 50/50 beam splitter 208a may receive a first optical signal from the first input waveguide 202a1 and a second optical signal from the second input waveguide 202a2.

Through the phenomena of evanescent coupling, a first 50% of the first optical signal may be directed into the first waveguide segment 204a1 and a second 50% of the first optical signal may be directed to the second waveguide segment 204a2. Concurrently, a first 50% of the second optical signal may be directed into the first waveguide segment 204a1 and a second 50% of the second optical signal may be directed to the second waveguide segment 204a2. In this regard, the first optical signal and the second optical signal may be evenly split between the first waveguide segment 204a1 and the second waveguide segment 204a2.

The first modulator portion 206a and the second modulator portion 206b may receive signals from the first waveguide segment 204a1 and the second waveguide segment 204a2, respectively, and may act to adjust amplitudes and/or phases of the received signals. In this regard, each of the first modulator portion 206a and the second modulator portion 206b may include an electro-optic material having optical properties (e.g., index of refraction and absorption coefficient) that may vary as a function of an applied electrical bias. As such, in certain embodiments, phases of optical signals propagating with the first modulator portion 206a and the second modulator portion 206b may be controllably varied through application of pre-determined bias potentials.

After propagation through the first 50/50 beam splitter 208a, signals propagating in the first waveguide segment 204a1 and the second waveguide segment 204a2 may have a well-defined phase relationship (e.g., in-phase, 180° out-of-phase, etc.) relative to one another. As such, the first modulator portion 206a and the second modulator portion 206b may introduce a pre-determined phase difference between signals respectively received from the first waveguide segment 204a1 and the second waveguide segment 204a2. Signals propagating through the first modulator portion 206a may then be provided as output to a third waveguide segment 204b1 and signals propagating through the second modulator portion 206b may be provided as output to a fourth waveguide segment 204b2. Respective signals received from the third waveguide segment 204b1 and the fourth waveguide segment 204b2 may then be provided to the second 50/50 beam splitter 208b.

The second 50/50 beam splitter may then act to send a first 50% of the signal received from the third waveguide segment 204b1 to the first output waveguide 202b1 and a second 50% of the signal received from the third waveguide segment 204b1 to the second output waveguide 202b2. Concurrently, a first 50% of the signal received from the fourth waveguide segment 204b2 may be sent to the first output waveguide 202b1 and a second 50% of the signal received from the fourth waveguide segment 204b2 may be sent to the second output waveguide 202b2.

The relative phase between the signals propagating in the third waveguide segment 204b1 and the fourth waveguide segment 204b2 may determine what signals appear in the first output waveguide 202b1 and the second output waveguide 202b2. Due to the phenomena of constructive and destructive interference, signals may be switched such that a signal only appears in the first output waveguide 202b1 (e.g., light beams may be in-phase) or in second output waveguide 202b2 (e.g., light beams may be out of phase). As such, by applying certain predetermined bias voltages to the first modulator portion 206a and the second modulator portion 206b, the optical switch 200b may provide switch functionality in that optical signals may be directed to either the first output waveguide 202b1 or to the second optical waveguide 202b2 as a function of bias voltages applied to the first modulator portion 206a and the second modulator portion 206b. Although both arms of the Mach-Zehnder interferometer are illustrated as including phase adjustment sections (i.e., the first modulator portion 206a and the second modulator portion 206b) other embodiments may include a Mach-Zehnder interferometer having a phase adjustment device in only a single arm.

Although a Mach-Zehnder interferometer implementation is illustrated in FIG. 2B, embodiments may not be limited to this particular switch architecture. Various other phase adjustment devices may be included within the scope of this disclosure, including ring resonator designs, Mach-Zehnder modulators, generalized Mach-Zehnder modulators, etc. In some embodiments, optical phase shifter devices described herein may be utilized within a quantum computing system. Alternatively, such optical phase shifter devices may be used in other types of optical systems. For example, other computational, communication, and/or technological systems may utilize photonic phase shifters to direct optical signals (e.g., single photons or continuous wave (CW) optical signals) within a system or network, and phase shifter architectures described herein may be used within these systems, in various embodiments.

Figure 2D:
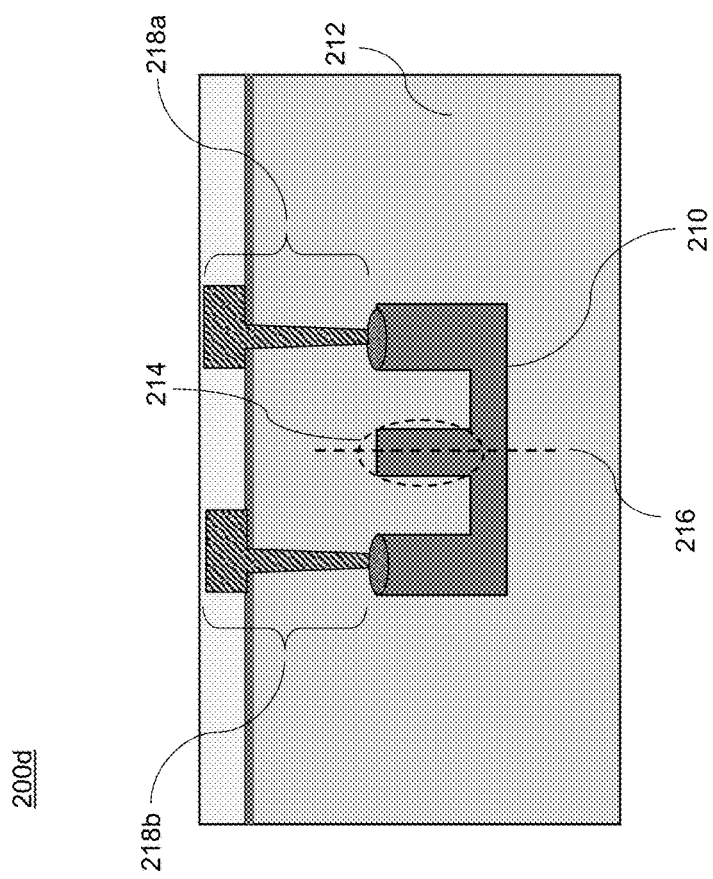
FIG. 2D is a vertical cross-sectional view of an electro-optic modulator having a p-n junction.
Figure 2C:
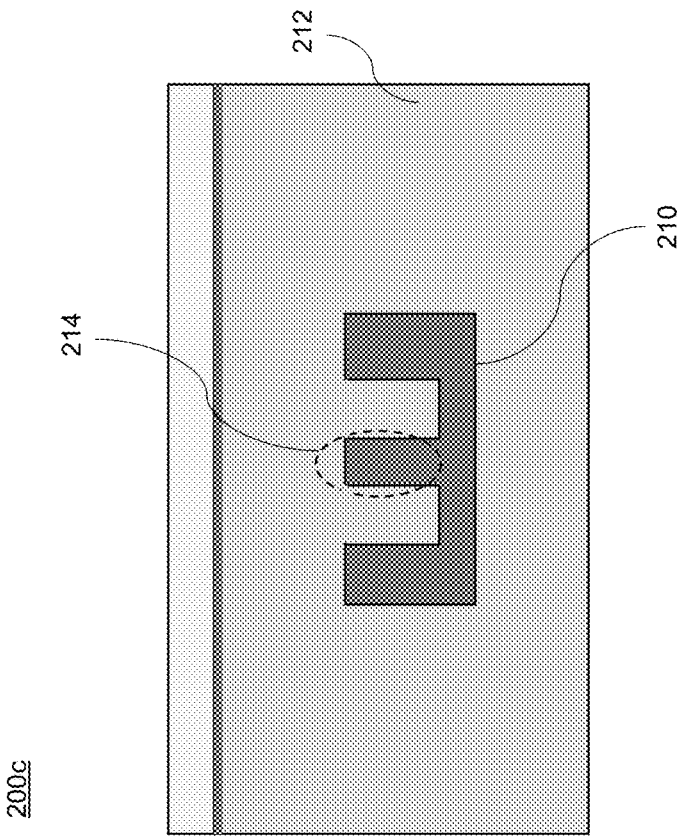
FIG. 2C is a vertical cross-sectional view of a silicon waveguide.

FIG. 2C is a vertical cross-sectional view of a silicon waveguide 200c. As mentioned above, the vertical plane defining the view illustrated in FIG. 2C is indicated by the cross-section C-C' in FIGS. 2A and 2B. The silicon waveguide 200c may include a core portion 210 and a cladding portion 212. The core portion 210 and the cladding portion 212 may each be configured to be transparent to light of a particular wavelength (e.g., infrared radiation). The core portion 210 and the cladding portion 212 may be formed using semiconductor device fabrication processes, as described in greater detail below.

The core portion 210 may be configured to have a higher index of refraction than that of the cladding portion 212. For example, the core portion 210 may be formed of doped or undoped silicon (e.g., index of refraction 3.88) and the cladding portion 212 may be formed of silicon oxide (e.g., index of refraction 1.46). Light may preferentially propagate in the core portion 210 due to the phenomena of total internal reflection resulting from the higher index of refraction of the core portion 210 relative to the cladding portion 212. For example, an optical mode may propagate within the core portion 210 and may have an electric field distribution that is confined to a central region 214 of the core portion. The specific shape of the core portion 210 shown in FIG. 2C is merely an example and the core portion 210 may have various other shapes in other applications.

FIG. 2D is a vertical cross-sectional view of an example electro-optic modulator 200d having a p-n junction. As mentioned above, the vertical plane defining the view illustrated in FIG. 2D is indicated by the cross-section D-D' in FIGS. 2A and 2B. The electro-optic modulator 200d may include a core portion 210 and a cladding portion 212 similar to the structure of the silicon waveguide 200c described above with reference to FIG. 2C. As such, an optical mode may propagate within the core portion 210 and may have an electric field distribution that is confined to a central region 214 of the core portion. In contrast to the silicon waveguide 200c of FIG. 2C, however, the core portion 210 of the electro-optic modulator 200d may have a doping profile that may exhibit an electro-optic effect. For example, the central region 214 of the electro-optic modulator 200d may be doped to form a p-n junction. For example, the central region 214 may include p-type dopants on a first side (e.g., to the left of the dashed line 216) and may include n-type dopants on a second side (e.g., to the right of the dashed line 216) of the central region 214.

The electro-optic modulator 200d may further include a first electrode 218a and a second electrode 218b. An applied potential difference (i.e., a voltage difference or bias) between the first electrode 218a and the second electrode 218b may alter a distribution of electrical charge carriers within the central region 214. According to the free carrier dispersion effect in silicon, the optical properties of the central region 214 may be changed by altering the carrier distribution by an applied bias. For example, in forward bias, carriers may be injected into the p-n junction reducing a size of the depletion region. In reverse bias, carriers may be depleted thereby increasing the size of the depletion region. In one configuration, the electro-optic modulator 200d may be operated in reverse bias (i.e., depletion mode) to have a low concentration of free carriers such that the central region 214 exhibits relatively low optical absorption.

FIG. 3A is a vertical cross-sectional view of a photonic device 300 having an optical transmission line 309, and FIG. 3B is a further vertical cross-sectional view of the photonic device of FIG. 3A, according to various embodiments. The plane defining the vertical cross-sectional view of FIG. 3B is indicated by the cross-section B-B' shown in FIG. 3A. The photonic device 300 may include a first terminal 302a formed of silicon and a second terminal 302b formed of polysilicon. A cladding dielectric layer 212 may be formed over a substrate 301 and may be formed so as to surround the first terminal 302a and the second terminal 302b.

A capacitor dielectric layer 304 may be disposed between the first terminal 302a and the second terminal 302b. In some embodiments, the capacitor dielectric layer 304 may be the same material as the cladding dielectric layer 212. Alternatively, the capacitor dielectric layer 304 may be a different material from the cladding dielectric layer 212. For example, in some embodiments the cladding dielectric layer 212 and the capacitor dielectric layer 304 may each be formed of silicon oxide. In other embodiments, the cladding dielectric layer 212 may be silicon dioxide and the cladding dielectric layer 212 may be a high-k dielectric material. Various other dielectric materials may be used for the capacitor dielectric layer 304 and the cladding dielectric layer 212 in other embodiments.

The first terminal 302a may be formed as a first three-dimensional structure extending along a first direction (i.e., along the y-axis of FIG. 3B). In this example embodiment, the first direction is directed into the plane of the FIG. 3A (i.e., the x-z plane) and is shown as the y-direction in FIG. 3B (i.e., in the y-z plane). Similarly, the second terminal 302b may be formed as a second three-dimensional structure extending along the first direction (i.e., along the y-axis). As shown in FIG. 3A, the first terminal may be configured to have a first U-shaped portion 306a in the plane of FIG. 3A, which is a first cross-sectional plane perpendicular to the first direction (i.e., the y-direction). Similarly, the second terminal 302b may be configured to have a second U-shaped portion 306b in the first cross-sectional plane.

As further shown in FIG. 3A, the first U-shaped portion 306a and the second U-shaped portion 306b may be arranged in an interlocking configuration having an overlapping region 308 such that, in the overlapping region, that the first terminal 302a and the second terminal 302b are further overlapping in a second cross-sectional plane (i.e., the y-z plane) that is perpendicular to the first cross-sectional plane, as shown in FIG. 3B. In this regard, the first U-shaped portion 306a may include a first folded segment 306a1 and a second folded segment 306a2. Similarly, the second U-shaped portion 306b may further include a first folded segment 306b1 and a second folded segment 306b2.

The overlapping region 308 may be configured as an optical transmission line 309 in which the first direction (i.e., the y-direction) is an optical propagation direction. In this regard, the size, spacing, and relative optical properties (i.e., dielectric constant and absorption constant) of the first terminal 302a, the second terminal 302b, and the capacitor dielectric layer 304 may be configured to allow propagation of an optical mode (i.e., an electromagnetic wave) that propagates along the first direction (i.e., the y-direction) and has an electric field distribution 310 in the first cross-sectional plane (i.e., the x-z plane) that spatially overlaps with the first terminal 302a and the second terminal 302b. As such, the overlapping region 308 is similar to a silicon waveguide 200c as described above with reference to FIG. 2C. In this regard, optical modes propagating in a silicon waveguide 200c in a photonic circuit (e.g., see FIG. 2A) may be optically coupled to the optical transmission line 309 formed by the overlapping region 308 of the photonic device 300 of FIGS. 3A and 3B.

The characteristics of the optical mode propagating in the optical transmission line 309 may be controlled by changing the optical properties of the first terminal 302a and the second terminal 302b. In this regard, the first terminal 302a, the second terminal 302b, and the capacitor dielectric layer 304 may be configured as a semiconductor-insulator-semiconductor capacitor that exhibits an electro-optic effect. As described above with reference to FIG. 2D, the optical properties of the first terminal 302a and the second terminal 302b may be changed by application of an applied potential difference (i.e., a voltage difference or bias) between the first terminal 302a and the second terminal 302b due to the free carrier dispersion effect in silicon and polysilicon. Under the application of a potential difference, carriers of opposite signs may build up on opposite sides of the capacitor dielectric layer 304. For example, the silicon of the first terminal 302a may have a p-type doping and the polysilicon of the second terminal 302b may have an n-type doping. As such, a positive charge density may be generated on surfaces of the first terminal 302a and a negative charge density may be generated on surfaces of the second terminal 302b in response to an applied potential difference.

As shown in FIG. 3A, the first terminal 302a may be electrically connected to a first electrode 312a through a first heavily doped semiconductor region 314a and the second terminal 302b may be electrically connected to a second electrode 312b through a second heavily doped semiconductor region 314b. The presence of the first heavily doped semiconductor region 314a and the second heavily doped semiconductor region 314b may allow ohmic contacts to be formed between the first electrode 312a and the first terminal 302a and between the second electrode 312b and the second terminal 302b. As such, voltages applied to the first electrode 312a and the second electrode 312b may be used to control the optical properties of the optical transmission line 309 by inducing changes to charge densities formed on the first terminal 302a and the second terminal 302b.

The magnitude of the positive and negative charge densities on the first terminal 302a and the second terminal 302b, respectively, depend on a corresponding magnitude of the applied potential difference (i.e., difference in voltages on the first electrode 312a and the second electrode 312b). The electro-optic effect due to free carrier dispersion depends on the magnitude of the positive and negative charge densities on the first terminal 302a and the second terminal 302b. As such, the optical properties of the optical transmission line 309 may be controlled by controlling the applied potential difference between the first terminal 302a and the second terminal 302b. In this regard, the optical transmission line 309 may have a first effective index of refraction $n_1$ in response to application of a first potential difference $V_1$ between the first terminal 302a and the second terminal 302b, and may have a second effective index of refraction $n_2$ in response to application of a second potential difference $V_2$ between the first terminal 302a and the second terminal 302b. Thus, characteristics of a propagating optical mode may be controlled through application of specific potential differences $V=V_1-V_2$ between the first terminal 302a and the second terminal 302b, as described in greater detail below.

In general, the phase of an optical mode propagating in the optical transmission line 309 depends on the effective index of refraction and on a distance over which the optical mode travels. Thus, for a sufficiently long propagation distance, a predetermined phase change of the optical mode may be achieved upon application of a predetermined potential difference V. The efficiency of a phase modulator may be quantified by specifying a voltage-times-distance product $V\pi \cdot L\pi$ that specifies an applied voltage $V\pi$ and a propagation distance La over which the phase of the optical mode may be shifted by $\pi$ radians (i.e., by 180°). This product means, that for a give distance of propagation $L\pi$, a phase shift of $\pi$ radians may be achieved with the application of a voltage (i.e., potential difference) of $V\pi$. Similarly, for an applied voltage of $V\pi$, a phase shift of $\pi$ radians may be achieved when the optical mode propagates a distance $L\pi$. Thus, the smaller that value of the $V\pi \cdot L\pi$, the better the phase modulator. In this sense, the product $V\pi \cdot L\pi$ may be used as a figure of merit with which to compare the relative performance of various optical phase modulators.

According to certain embodiments, the photonic device 300 of FIGS. 3A and 3B may have a voltage-times-length product $V\pi \cdot L\pi$ that is less than 0.1 V·cm. This means that a photonic device 300 having a length along the propagation direction (i.e., into the plane of FIG. 3A along the y-axis of FIG. 3B) of, for example, 300 microns (i.e., $L\pi \approx 300$ microns) may induce a phase shift of $\pi$ radians with the application of a voltage of $V\pi \approx 3.3$ V.

As a further example, a photonic device 300 having a voltage-times-length product $V\pi \cdot L\pi$ that is 0.06 V·cm and that has length along the propagation direction of $L\pi \approx 150$ microns may be controlled to produce a phase shift of $\pi$ radians with the application of a voltage of $V\pi \approx 4.0$ V. Thus, according to various embodiments, a photonic device 300 may be configured such that each of the first terminal 302a, the second terminal 302b, and the capacitor dielectric layer 304 have a length 316 (e.g., see FIG. 3B) along the optical propagation direction that is in a range from approximately 150 microns to approximately 300 microns. Such a photonic device 300 may be configured to act as an optical modulator that may induce a phase shift of $\pi$ radians with application of voltages between 1 V and 6 V.

The optical properties of a photonic device 300 may depend on the material properties of the various components as well as the dimensions of the various components. In this regard, the dimensions of the optical transmission line 309 may be comparable to, or smaller than, a wavelength of an optical mode that may propagate on the optical transmission line 309. Photonic sources 102 (e.g., see FIG. 1) typically generate light having a wavelength that is one of 850 nm, 1300 nm, or 1550 nm. As such, the components of the optical transmission line 309 may have dimensions comparable to or smaller than these wavelengths. In an example embodiment, a photonic device 300 may have an optical transmission line 309 having a width 318 in the first cross-sectional plane (i.e., the x-z plane) that is between 400 nm and 500 nm and a thickness 320 in the first cross-sectional plane that is between 150 nm and 250 nm.

As described above, the photonic device 300 may be designed to support an optical mode (i.e., an electromagnetic wave) that propagates along the first direction (i.e., the y-direction) and has an electric field distribution 310 in the first cross-sectional plane (i.e., the x-z plane) that spatially overlaps with the first terminal 302a and the second terminal 302b. An electric field distribution 310 having an increased spatial overlap with the first terminal 302a and the second terminal 302b may provide increased efficiency (e.g., a smaller figure-of-merit $V\pi \cdot L\pi$) of the photonic device 300 relative to other embodiments having reduced spatial overlap. In this regard, thicknesses of the various connected layers of the first terminal 302a and the second terminal 302b may be chosen to be smaller than a wavelength of the propagating optical mode. According to some embodiments, the first terminal 302a may include connected layers (first folded segment 306a1 and second folded segment 306a2) that may have a thickness 322a that is between 50 nm and 80 nm. Similarly, the second terminal 302b may include connected layers (first folded segment 306b1 and second folded segment 306b2) that may also have a thickness 322b that is between 50 nm and 80 nm. In various embodiments, the capacitor dielectric layer 304 may be chosen to have a thickness 324 that is in a range from approximately 2 nm to 7 nm.

As described above, the overlapping region 308 that forms the optical transmission line 309 may function as a semiconductor-insulator-semiconductor-capacitor structure. In certain embodiments, such a capacitor structure may have a capacitance per unit length in the optical propagation direction that is in a range from approximately 1 fF/micron to approximately 20 fF/micron in response to an applied potential difference between the first terminal and the second terminal that is between 0 V and 6 V. The use of thin layers (306a1, 306a2, 306b1, 306b2) provides the capacitance values mentioned above and may allow efficient operation of the photonic device 300 with relatively low optical absorption relative to comparative example devices having thicker layers. For example, in certain embodiments, the optical transmission line 309 of the photonic device 300 may exhibit an optical insertion loss that is less than 0.5 dB relative to a silicon waveguide structure.

FIG. 4A is a vertical cross-sectional view of a further photonic device 400 having an optical transmission line 309, and FIG. 4B is a further vertical cross-sectional view of the photonic device 400 of FIG. 4A, according to various embodiments. The plane defining the vertical cross-sectional view of FIG. 4B is indicated by the cross-section B-B' shown in FIG. 4A. The photonic device 400 may be similar to the photonic device 300 of FIGS. 3A and 3B. In this regard, the photonic device 400 may include a first terminal 302a formed of a p-type semiconductor 602 (e.g., see FIG. 6) and a second terminal 302b formed of an n-type semiconductor 902 (e.g., see FIG. 9). The first terminal 302a and the second terminal 302b may each be configured as a three-dimensional structure extending along a first direction (i.e., into the plane of FIG. 4A and the y-axis of FIG. 4B) and having an overlapping portion (i.e., within an overlapping region 308) in a first cross-sectional plane (i.e., the x-z plane) perpendicular to the first direction (i.e., the y-axis). The respective overlapping portions of the first terminal 302a and the second terminal 302b may be arranged in an interlocking configuration within the overlapping region 308 such that, in the overlapping region 308, the first terminal 302a and the second terminal 302b are further overlapping in a second cross-sectional plane (i.e., the y-z plane of FIG. 4B) that is perpendicular to the first cross-sectional plane.

As with the photonic device 300 of FIGS. 3A and 3B, the photonic device 400 of FIGS. 4A and 4B may further include a capacitor dielectric layer 304 disposed between the first terminal 302a and the second terminal 302b and a cladding dielectric layer 212 surrounding the first terminal 302a and the second terminal 302b. Further, as with the photonic device 300 of FIGS. 3A and 3B, the overlapping region 308 of the photonic device 400 of FIGS. 4A and 4B may further be configured as an optical transmission line 309 in which the first direction (i.e., the y-axis) is an optical propagation direction. For example, the size, spacing, and relative optical properties (i.e., dielectric constant and absorption constant) of the first terminal 302a, the second terminal 302b, and the capacitor dielectric layer 304, may allow propagation of an optical mode (i.e., an electromagnetic wave) that propagates along the first direction (i.e., the y-direction) and has an electric field distribution 310 in the first cross-sectional sectional plane (i.e., the x-z plane) that spatially overlaps with the first terminal 302a and the second terminal 302b.

Unlike the photonic device 300 of FIGS. 3A and 3B, however, the overlapping region 308 may have additional structure. In this regard, as shown in FIGS. 4A and 4B, within the overlapping region 308 the first terminal 302a and the second terminal 302b may each be folded twice to have three overlapping segments. As shown in FIG. 4B, for example, the first terminal 302a may have a first folded segment 306a1, a second folded segment 306a2, and a third folded segment 306a3. Similarly, the second terminal 302b may have a first folded segment 306b1, a second folded segment 306b2, and a third folded segment 306b3.

In further embodiments, the overlapping region 308 may include various numbers of folded segments. For example, each of the first terminal 302a and the second terminal 302b may be folded an integer number (m) of times (not shown) such that the overlapping region 308 includes an alternating stack of m+1 first folded segments of the first terminal 302a and m+1 second folded segments of the second terminal 302b. In such embodiments, the integer m may be greater than or equal to 1. The embodiment photonic device 400 of FIGS. 4A and 4B is an example in which m=2. Various other embodiments may have m=3, 4, 5, etc.

The overlapping region 308 may be configured as an optical transmission line 309 that supports an optical mode having an electric field distribution 310 in the first cross-sectional plane (i.e., the x-z plane) that spatially overlaps with each of the m+1 first folded segments of the first terminal 302a and with each of the m+1 second folded segments of the second terminal 302b. As in the embodiment photonic device 300 of FIGS. 3A and 3B, the first terminal 302a may include p-type silicon 602 and the second terminal may include n-type polysilicon 902. Various other semiconductor materials (e.g., oxide semiconductors) may be used in other embodiments. The various dimensions may be optimized to have similar or improved performance relative to the embodiment photonic device 300 of FIGS. 3A and 3B. For example, in some embodiments, a photonic device 400 may have a voltage times length product Vπ·Lπ (which characterizes a 180° phase shift of an optical mode propagating in the optical transmission line) that is less than 0.1 V-cm and an optical insertion loss of less than 0.5 dB relative to a silicon waveguide structure.

Figure 5:
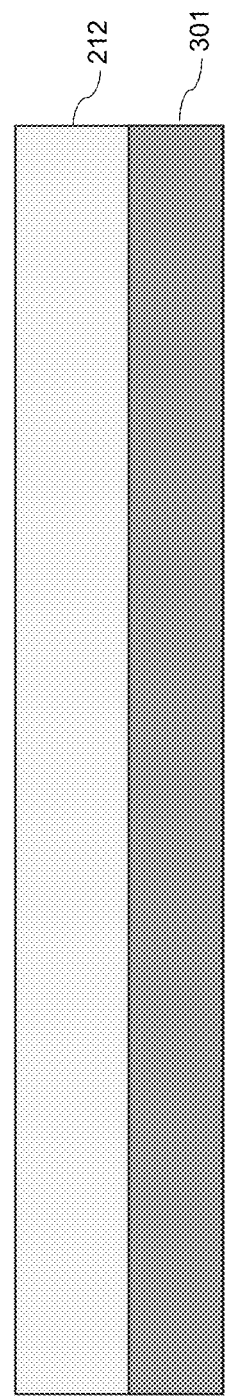
FIG. 5 is a vertical cross-sectional view of an intermediate structure that may be used in the formation of a photonic device, according to various embodiments.

FIG. 5 is a vertical cross-sectional view of an intermediate structure 500 that may be used in the formation of a photonic device (300, 400), according to various embodiments. The intermediate structure 500 may include a cladding dielectric layer 212 formed over a substrate 301. The substrate 301 may include a bulk semiconductor substrate such as a silicon substrate in which the semiconductor material layer continuously extends from a top surface of the substrate 301 to a bottom surface of the substrate 301, or a semiconductor-on-insulator layer including a semiconductor material layer as a top semiconductor layer overlying a buried insulator layer (such as a silicon oxide layer).

The cladding dielectric layer 212 may be formed of a suitable dielectric material, such as silicon dioxide (SiO2) silicon nitride (SiN, Si3N4), silicon carbide (SiC), undoped silicate glass, a doped silicate glass, organosilicate glass, amorphous fluorinated carbon, porous variants thereof, or combinations thereof. Other dielectric materials are within the contemplated scope of disclosure. The cladding dielectric layer 212 may be deposited by a conformal deposition process (such as low pressure chemical vapor deposition (CVD)) or a self-planarizing deposition process (such as spin coating). Other conformal deposition processes may include plasma enhanced chemical vapor deposition (PECVD), atomic layer deposition (ALD), physical vapor deposition (PVD), a high density plasma CVD (HDPCVD) process, a metalorganic CVD (MOCVD) process, a sputtering process, laser ablation, etc. Excess portions of the deposited cladding dielectric layer 212 may be removed from above the top surface of the intermediate structure 500 by a planarization process, for example, by chemical mechanical planarization (CMP).

Figure 6:
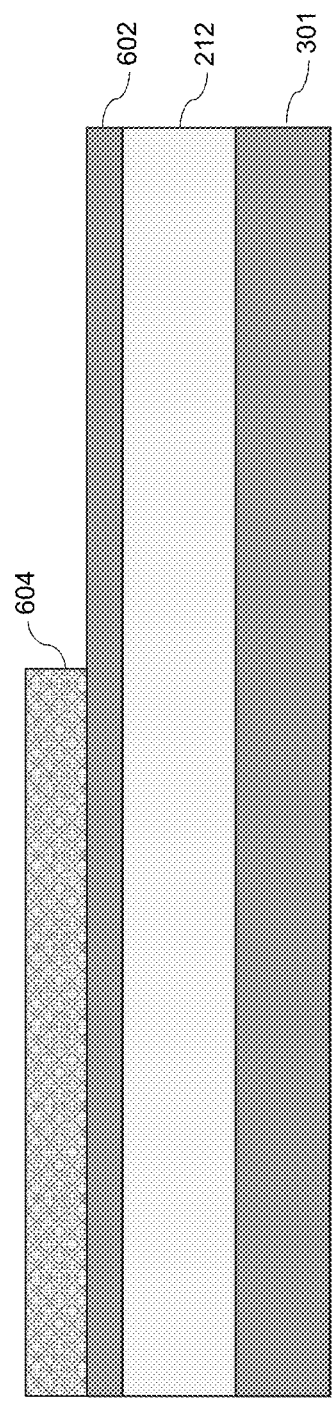
FIG. 6 is a vertical cross-sectional view of a further intermediate structure that may be used in the formation of a photonic device, according to various embodiments.

FIG. 6 is a vertical cross-sectional view of a further intermediate structure 600 that may be used in the formation of a photonic device (300, 400), according to various embodiments. The intermediate structure 600 may be formed by depositing a blanket layer of silicon 602 over the cladding dielectric layer 212 followed by formation of a patterned photoresist 604 over the blanket layer of silicon 602. The blanket layer of silicon 602 may be formed by performing an epitaxial growth process using a technique such as CVD. The blanket layer of silicon 602 may further be doped using an in-situ doping process.

In-situ doping during CVD of epitaxial silicon layers makes it possible to fabricate crystalline silicon layers with thin highly doped layers with high dopant activation. Such a process does not add ion-implantation mediated damage to the crystalline structure of the silicon, which may otherwise result in enhanced dopant diffusion, additional optical losses, and other complications during epitaxial overgrowth. Compared to ion-implantation, in-situ doping gives greater control over the doped layer thicknesses, particularly for boron for which the formation of highly doped shallow wells with ion-implantation technology is particularly difficult. Moreover, in-situ doped silicon does not require dopant activation and thus the thermal exposure after deposition of in-situ doped layers is limited to subsequent silicon deposition (at 800° C.). In this way, the blanket layer of silicon 602 may be formed as a crystalline layer that is homogenously deposited by CVD using disilane ($Si_2H_6$) as a precursor at a temperature of 800° C. with a deposition rate of about 5 nm/min. Dopants may be added by introducing diborane ($B_2H_6$), for example, for p-doping. The blanket layer of silicon 602 may be deposited to have a thickness that is between 50 nm and 80 nm.

The patterned photoresist 604 may be formed by depositing a blanket layer of photoresist (not shown) over the blanket layer of silicon 602. The blanket layer of photoresist may then be patterned using lithographic techniques to form the patterned photoresist 604. The patterned photoresist 604 may then be used as an etch mask during a subsequent etch process that may be performed to etch the blanket layer of silicon 602.

Figure 7:
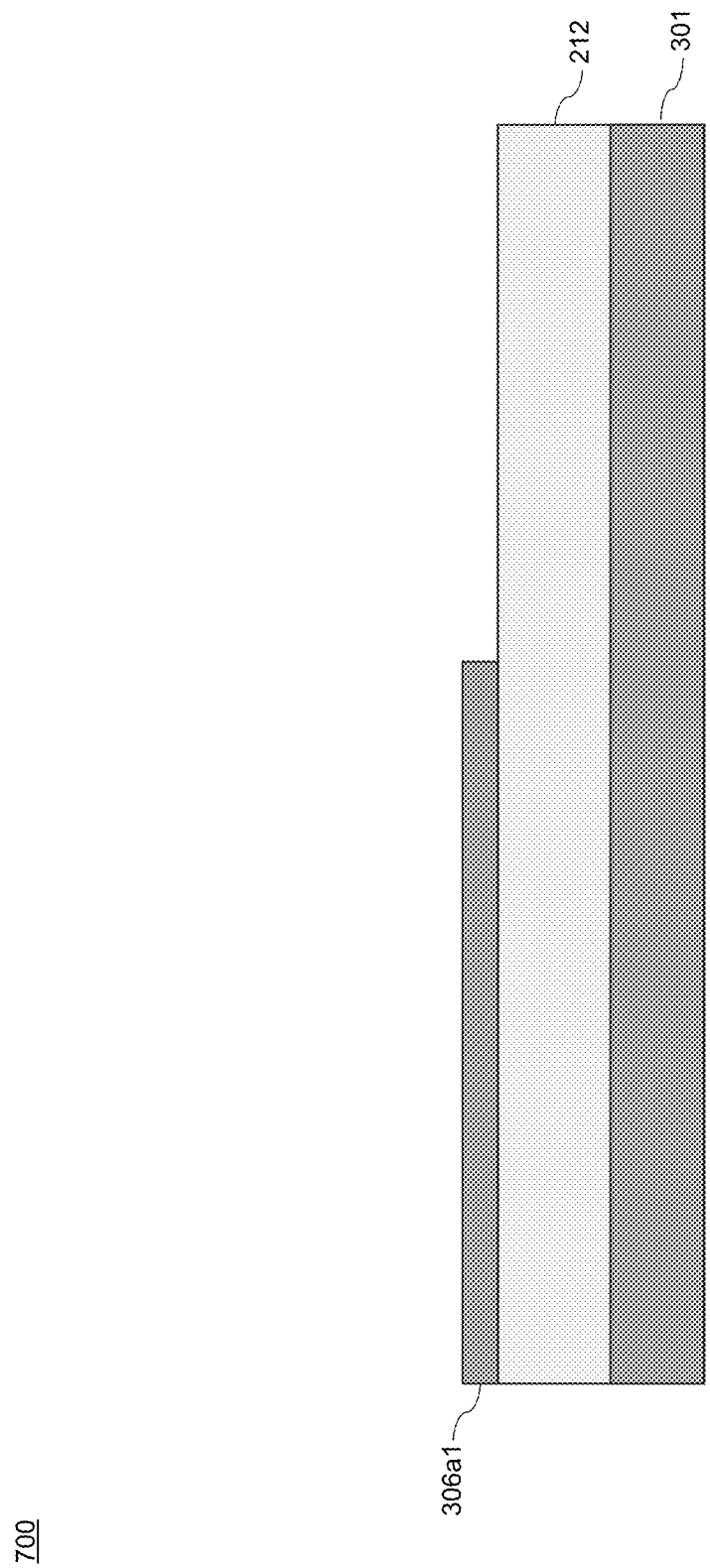
FIG. 7 is a vertical cross-sectional view of a further intermediate structure that may be used in the formation of a photonic device, according to various embodiments.

FIG. 7 is a vertical cross-sectional view of a further intermediate structure 700 that may be used in the formation of a photonic device (300, 400), according to various embodiments. In this regard, the intermediate structure 700 may be formed from the intermediate structure 600 of FIG. 6 by performing an anisotropic etch process selective to the cladding layer 212 using the patterned photoresist 604 of FIG. 6 as an etch mask. In this regard, the anisotropic etch process may reduce a width of the blanket layer of silicon 602 as shown in FIG. 7. The resulting p-doped silicon layer may form the first folded segment 306a1 of the first terminal 302a described above with reference to FIGS. 3B and 4B. After performing the anisotropic etch process, the patterned photoresist 604 may be removed, for example, by ashing or by dissolution with a solvent.

Figure 8:
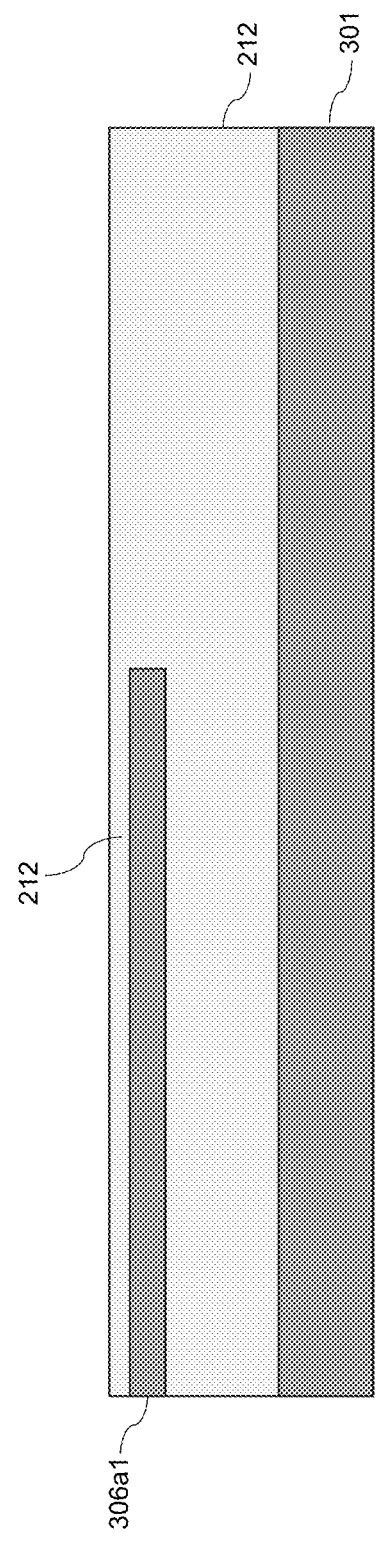
FIG. 8 is a vertical cross-sectional view of a further intermediate structure that may be used in the formation of a photonic device, according to various embodiments.

FIG. 8 is a vertical cross-sectional view of a further intermediate structure 800 that may be used in the formation of a photonic device (300, 400), according to various embodiments. The intermediate structure 800 may be formed from the intermediate structure 700 of FIG. 7 by forming an additional cladding dielectric layer 212 over the intermediate structure 700. In this regard, a blanket layer (not shown) of dielectric material may be deposited over the intermediate structure 700 by performing a conformal deposition process such as CVD or a self-planarizing deposition process (such as spin coating). Other conformal deposition processes may include PECVD, ALD, PVD, HDPCVD processes, an MOCVD process, a sputtering process, laser ablation, etc. Excess portions of the deposited cladding dielectric layer 212 may be removed from above the top surface of the intermediate structure 800 by a planarization process such as, for example, CMP.

Figure 9:
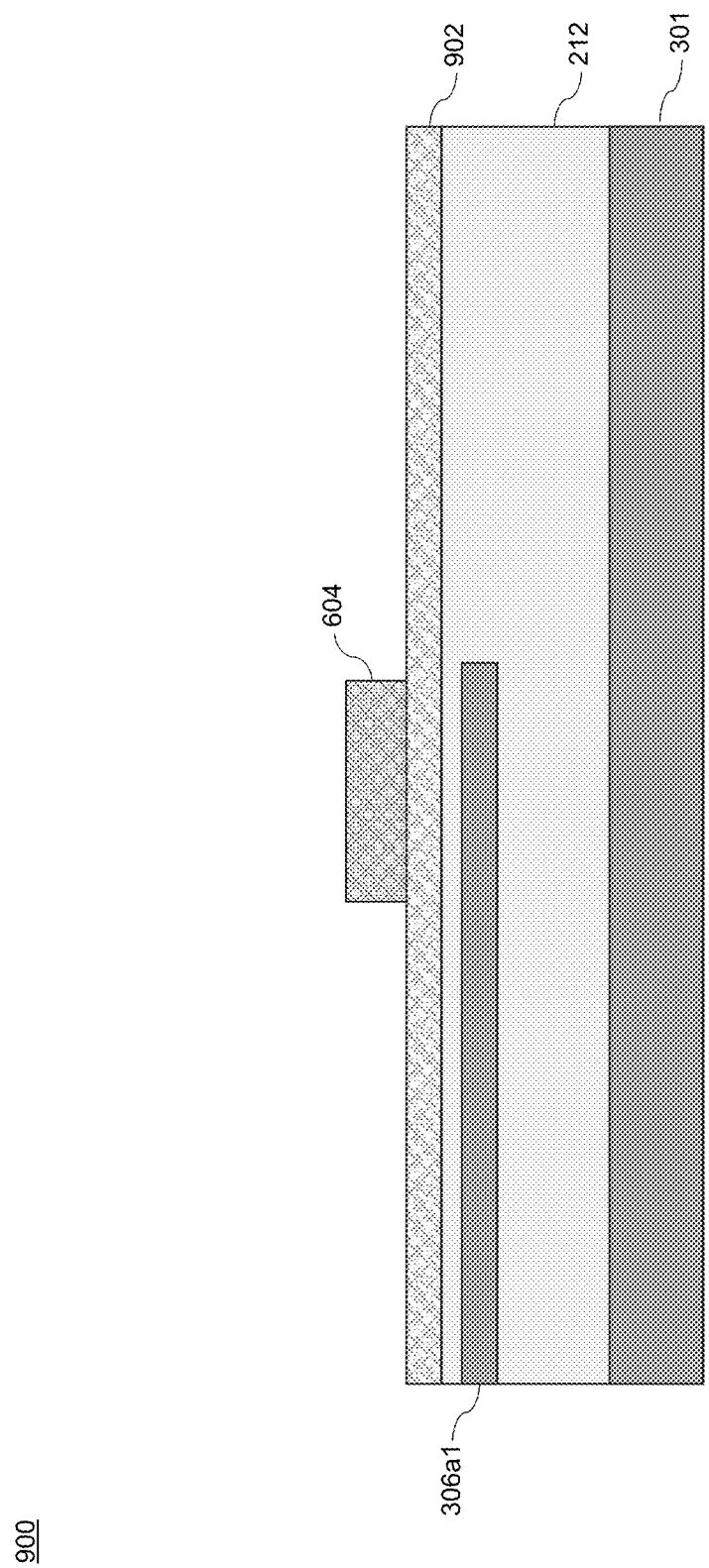
FIG. 9 is a vertical cross-sectional view of a further intermediate structure that may be used in the formation of a photonic device, according to various embodiments.

FIG. 9 is a vertical cross-sectional view of a further intermediate structure 900 that may be used in the formation of a photonic device (300, 400), according to various embodiments. The intermediate structure 900 may be formed from the intermediate structure 800 of FIG. 8 by depositing a blanket layer of polysilicon 902 over the intermediate structure 800 and forming a patterned photoresist 604 over the layer of polysilicon 902. The blanket layer of polysilicon 902 may be deposited using CVD or by performing a low-pressure CVD (LPCVD) process. In an LPCVD process, for example, silane gas may be used a precursor and may dissociate into silicon and hydrogen at a pressure between 25 Pa to 150 Pa and at a temperature around 600° C. The silane gas may be introduced as either 100% silane or as 20% to 30% silane diluted with nitrogen. As with the blanket layer of silicon 602, the blanket layer of polysilicon 902 may be deposited using an in-situ doping process. In this regard, an n-type dopant such as phosphorus may be introduced by combining silane with phosphine gas ($PH_3$) in the LPCVD reaction chamber. In this way, the blanket layer of polysilicon 902 may be deposited as n-type polysilicon.

The patterned photoresist 604 may be formed by depositing a blanket layer of photoresist (not shown) over the blanket layer of polysilicon 902. The blanket layer of photoresist may then be patterned using lithographic techniques to form the patterned photoresist 604. The patterned photoresist 604 may then be used as an etch mask during a subsequent etch process that may be performed to etch the blanket layer of polysilicon 902.

Figure 10:
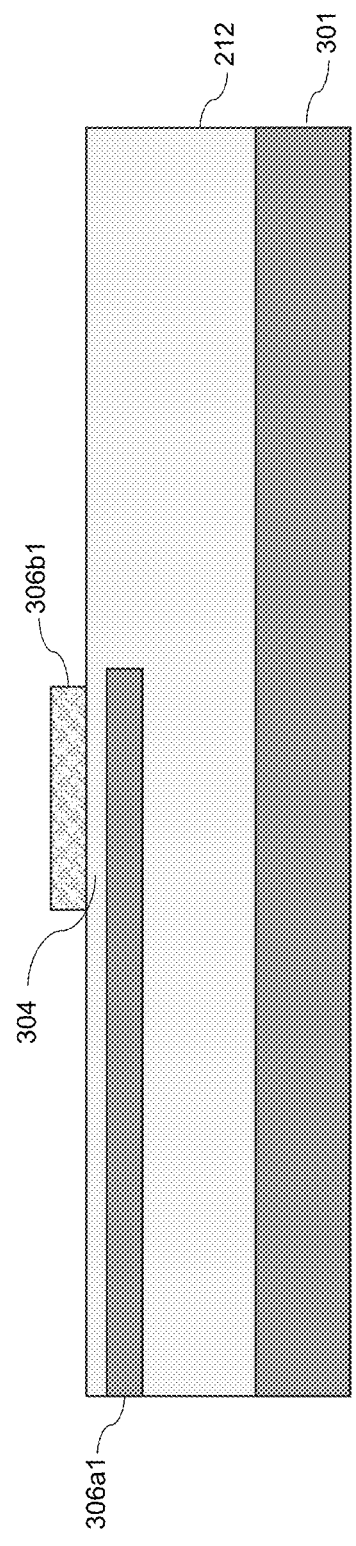
FIG. 10 is a vertical cross-sectional view of a further intermediate structure that may be used in the formation of a photonic device, according to various embodiments.
Figure 11:
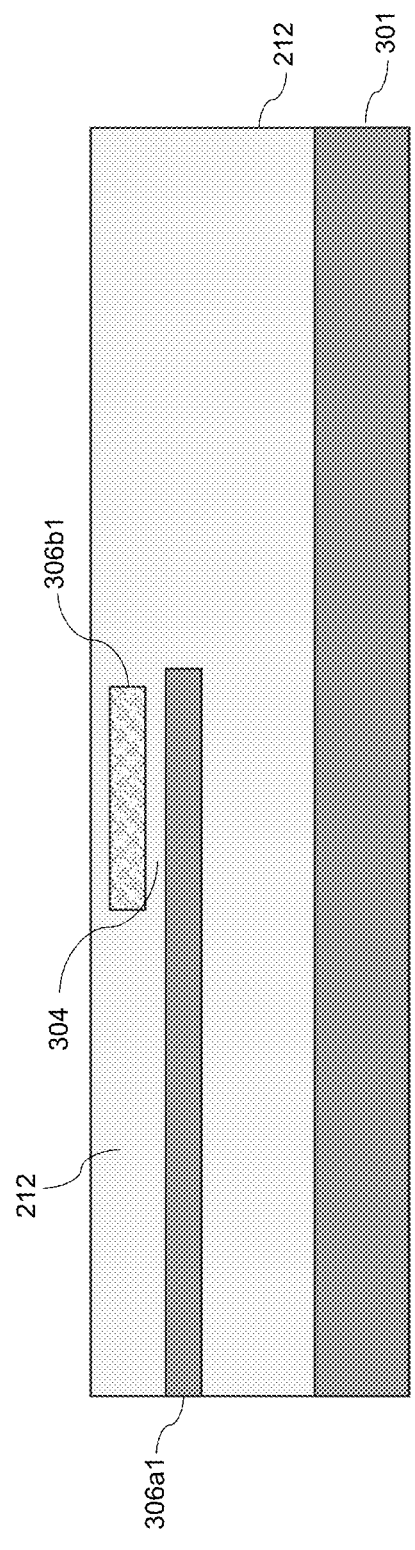
FIG. 11 is a vertical cross-sectional view of a further intermediate structure that may be used in the formation of a photonic device, according to various embodiments.

FIG. 10 is a vertical cross-sectional view of a further intermediate structure 1000 that may be used in the formation of a photonic device (300, 400), according to various embodiments. The intermediate structure 1000 may be formed from the intermediate structure 900 of FIG. 9 by performing an anisotropic etch process selective to the cladding layer 212 using the patterned photoresist 604 of FIG. 9 as an etch mask. In this regard, the anisotropic etch process may reduce a width of the blanket layer of polysilicon 902 as shown in FIG. 9. The resulting n-doped polysilicon layer may form the first folded segment 306*b*1 of the second terminal 302*b* described above with reference to FIGS. 3B and 4B. After performing the anisotropic etch process, the patterned photoresist 604 may be removed, for example, by ashing or by dissolution with a solvent. A shown in FIG. 10, a thin layer of the cladding dielectric layer 212 formed between the first folded segment 306*a*1 of the first terminal 302*a* and the first folded segment 306*b*1 of the second terminal 302*b* may act as the capacitor dielectric layer 304 described above with reference to FIG. 3A FIG. 11 is a vertical cross-sectional view of a further intermediate structure 1100 that may be used in the formation of a photonic device (300, 400), according to various embodiments. The intermediate structure 1100 may be formed from the intermediate structure 1000 of FIG. 10 by forming an additional cladding dielectric layer 212 over the intermediate structure 1000. In this regard, a blanket layer (not shown) of dielectric material may be deposited over the intermediate structure 1000 by performing a conformal deposition process such as CVD or a self-planarizing deposition process (such as spin coating). Other conformal deposition processes may include PECVD, ALD, PVD, HDPCVD processes, an MOCVD process, a sputtering process, laser ablation, etc. Excess portions of the deposited cladding dielectric layer 212 may be removed from above the top surface of the intermediate structure 1100 by a planarization process such as, for example, CMP.

Figure 12:
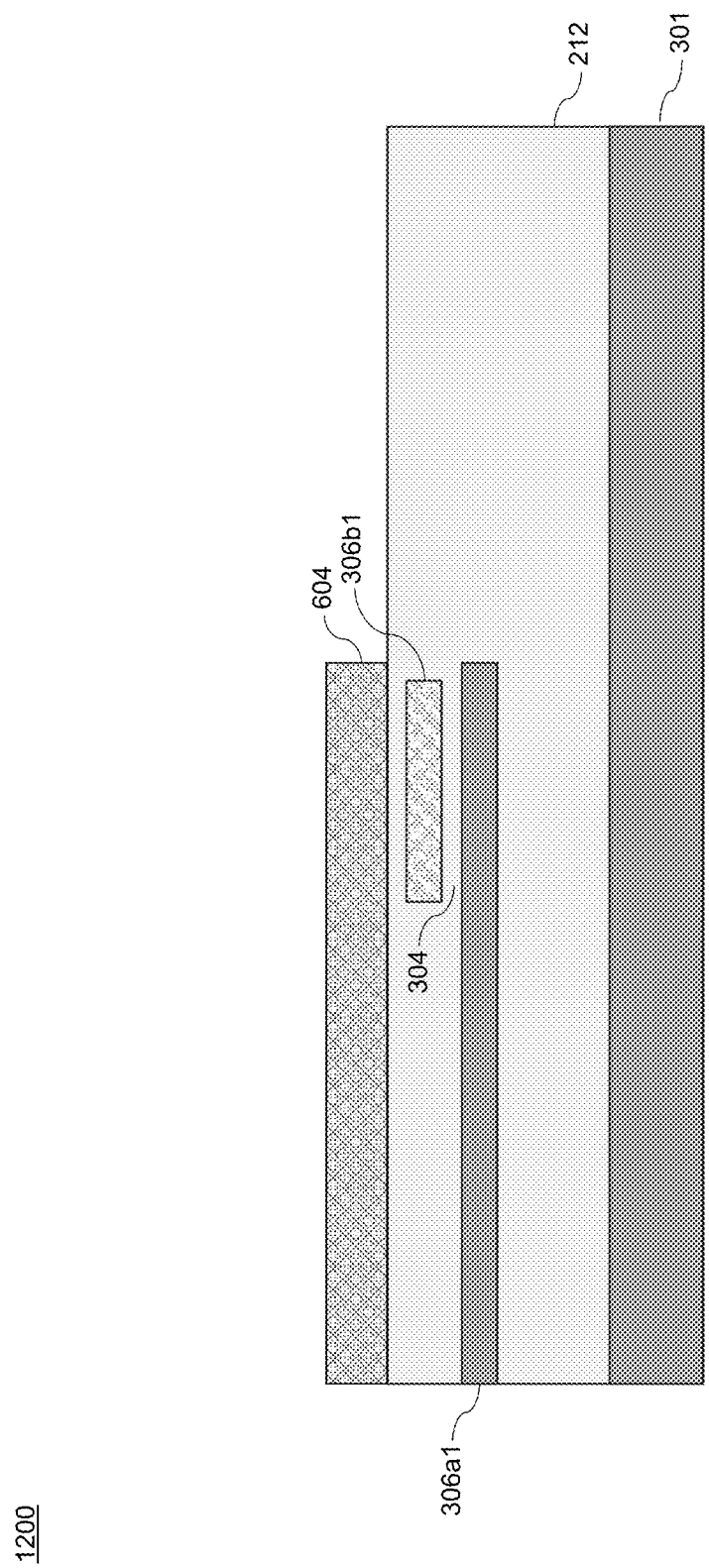
FIG. 12 is a vertical cross-sectional view of a further intermediate structure that may be used in the formation of a photonic device, according to various embodiments.

FIG. 12 is a vertical cross-sectional view of a further intermediate structure 1200 that may be used in in the formation of a photonic device (300, 400), according to various embodiments. The intermediate structure 1200 may be formed from the intermediate structure 1100 of FIG. 11 by forming a patterned photoresist 604 over the intermediate structure 1100 of FIG. 11. The patterned photoresist 604 may be formed by depositing a blanket layer of photoresist (not shown) over the blanket layer of cladding dielectric layer 212. The blanket layer of photoresist may then be patterned using lithographic techniques to form the patterned photoresist 604. The patterned photoresist 604 may then be used as an etch mask during a subsequent etch process that may be performed to etch an unmasked portion of the cladding dielectric layer 212 as shown in greater detail in FIG. 13, below.

Figure 13:
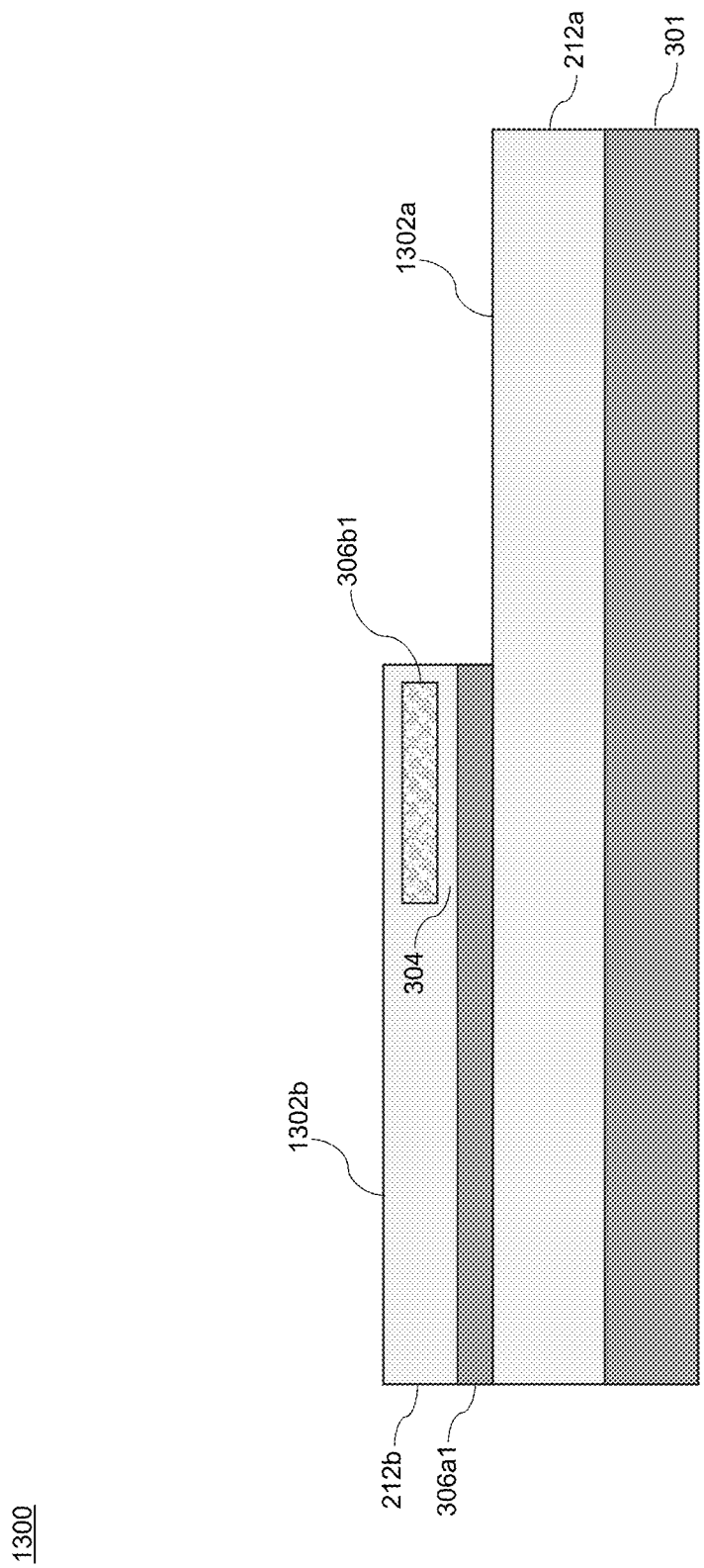
FIG. 13 is a vertical cross-sectional view of a further intermediate structure that may be used in the formation of a photonic device, according to various embodiments.

FIG. 13 is a vertical cross-sectional view of a further intermediate structure 1300 that may be used in the formation of a photonic device (300, 400), according to various embodiments. The intermediate structure 1300 may be formed from the intermediate structure 1200 of FIG. 12 by performing an anisotropic etch process to remove a portion of the cladding dielectric layer 212 is not masked by the patterned photoresist 604. As shown in FIG. 13, the etching process may generate a stepped structure in which the cladding dielectric layer 212 has been divided into a lower portion 212*a* having a first surface 1302*a* and an upper portion 212*b* having a second surface 1302*b*.

Figure 14:
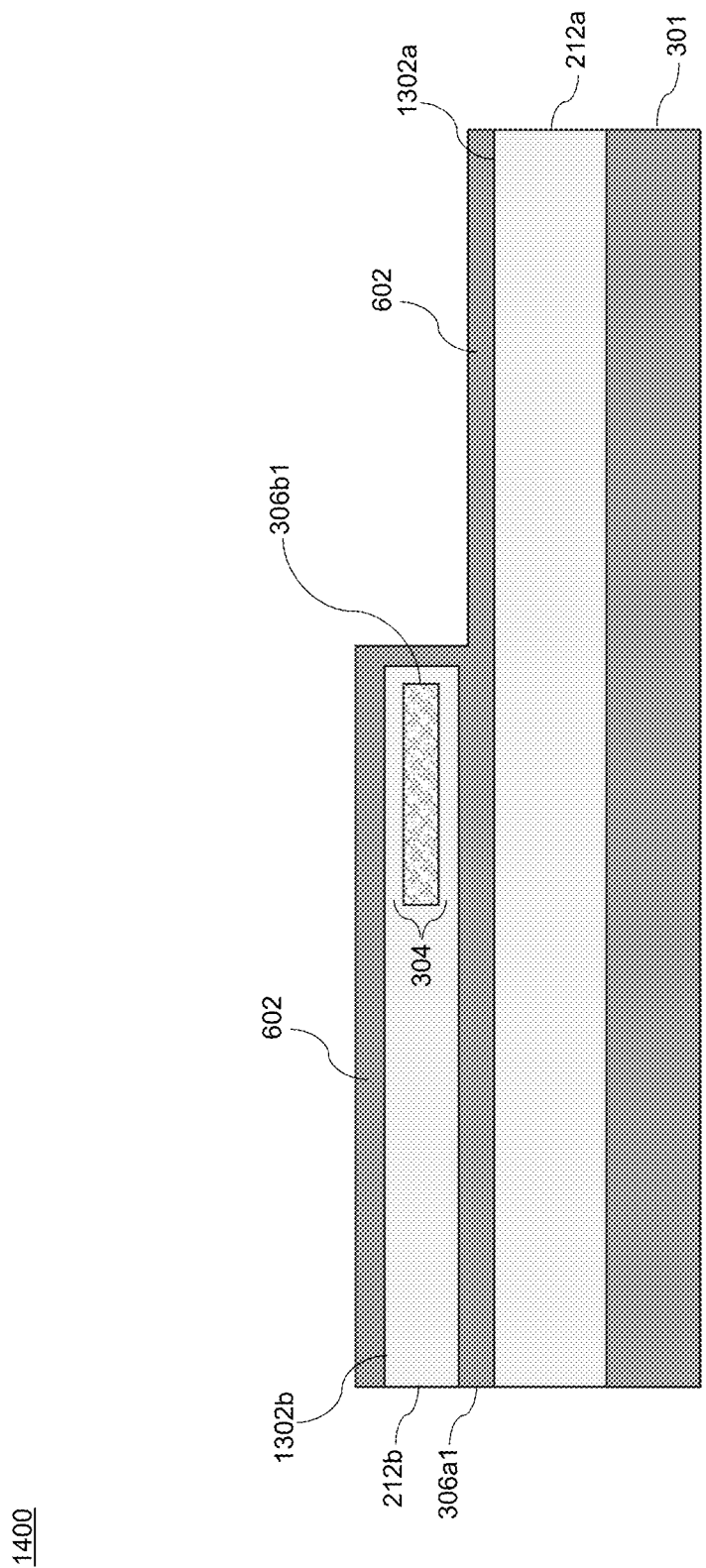
FIG. 14 is a vertical cross-sectional view of a further intermediate structure that may be used in the formation of a photonic device, according to various embodiments.

FIG. 14 is a vertical cross-sectional view of a further intermediate structure 1400 that may be used in the formation of a photonic device (300, 400), according to various embodiments. The intermediate structure 1400 may be formed from the intermediate structure 1300 of FIG. 13 by depositing a blanket layer of silicon 602 over the intermediate structure 1300 of FIG. 13. In this regard, the blanket layer of silicon 602 may be deposited using CVD process in which p-type dopants may be introduced using an in-situ doping process, as described in greater detail with reference to FIG. 6, above. As shown, the blanket layer of silicon 602 may be deposited over both the first surface 1302*a* and the second surface 1302*b*. In this way, the blanket layer of silicon 602 may make contact with, and may form a unified structure with, the first folded segment 306*a*1 of the first terminal 302*a* to be formed subsequently. Further, portions of the cladding dielectric layer 212 formed both above and below the first folded segment 306*b*1 of the second terminal 302*b* may serve as respective portions of the capacitor dielectric layer 304, as shown.

Figure 15:
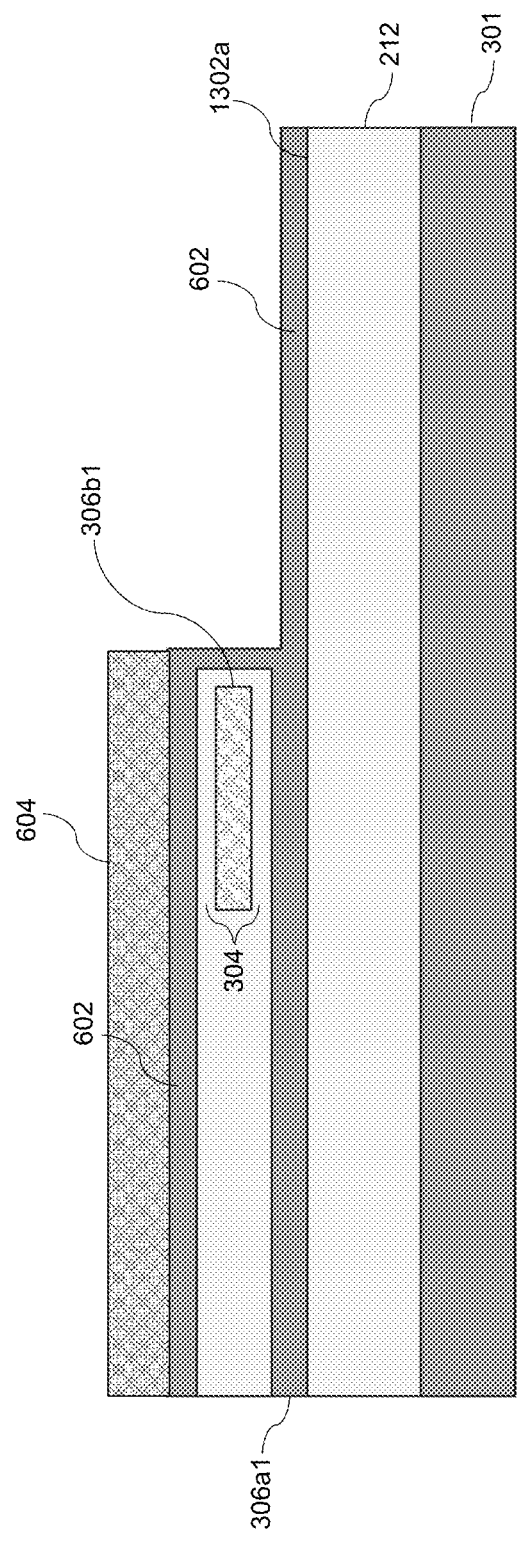
FIG. 15 is a vertical cross-sectional view of a further intermediate structure that may be used in the formation of a photonic device, according to various embodiments.

FIG. 15 is a vertical cross-sectional view of a further intermediate structure 1500 that may be used in the formation of a photonic device (300, 400), according to various embodiments. The intermediate structure 1500 may be formed from the intermediate structure 1400 of FIG. 14 by forming a patterned photoresist 604 over the intermediate structure 1400 of FIG. 14. The patterned photoresist 604 may be formed by depositing a blanket layer of photoresist (not shown) over the blanket layer of silicon 602. The blanket layer of photoresist may then be patterned using lithographic techniques to form the patterned photoresist 604. The patterned photoresist 604 may then be used as an etch mask during a subsequent etch process that may be performed to etch the blanket layer of silicon 602.

Figure 16:
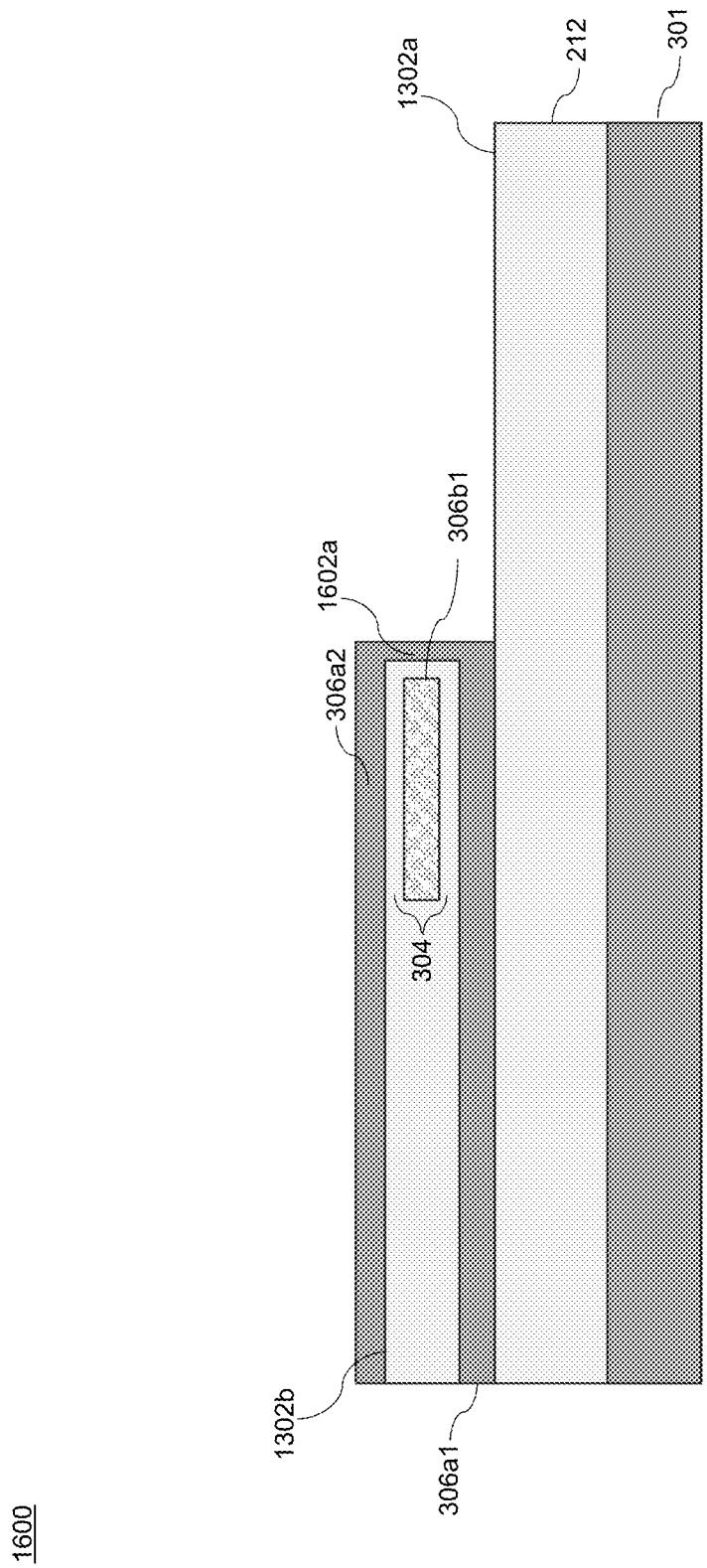
FIG. 16 is a vertical cross-sectional view of a further intermediate structure that may be used in the formation of a photonic device, according to various embodiments.

FIG. 16 is a vertical cross-sectional view of a further intermediate structure 1600 that may be used in the formation of a photonic device (300, 400), according to various embodiments. The intermediate structure 1600 may be formed from the intermediate structure 1500 of FIG. 15 by performing an anisotropic etch process to etch a portion of the blanket layer of silicon 602 that is not masked by the patterned photoresist 604 of FIG. 15. The patterned photoresist 604 may then be removed by ashing or by dissolution with a solvent. As shown, the remaining portion of the blanket layer of silicon 602 formed over the second surface 1302*b* may form the second folded segment 306*a*2 of the first terminal 302*a*, described above with reference to FIGS. 3B and 4B, to be formed subsequently. Further, as shown in FIG. 16, the anisotropic etch process may be performed so as to form a first vertical edge portion 1602*a* of the blanket layer of silicon 602. In this regard, the first vertical edge portion 1602*a* may connect the subsequently formed layer (i.e., the second folded segment 306*a*2) to the previously formed layer (i.e., the first folded segment 306*a*1) of the first terminal 302*a* to be formed subsequently.

Figure 17:
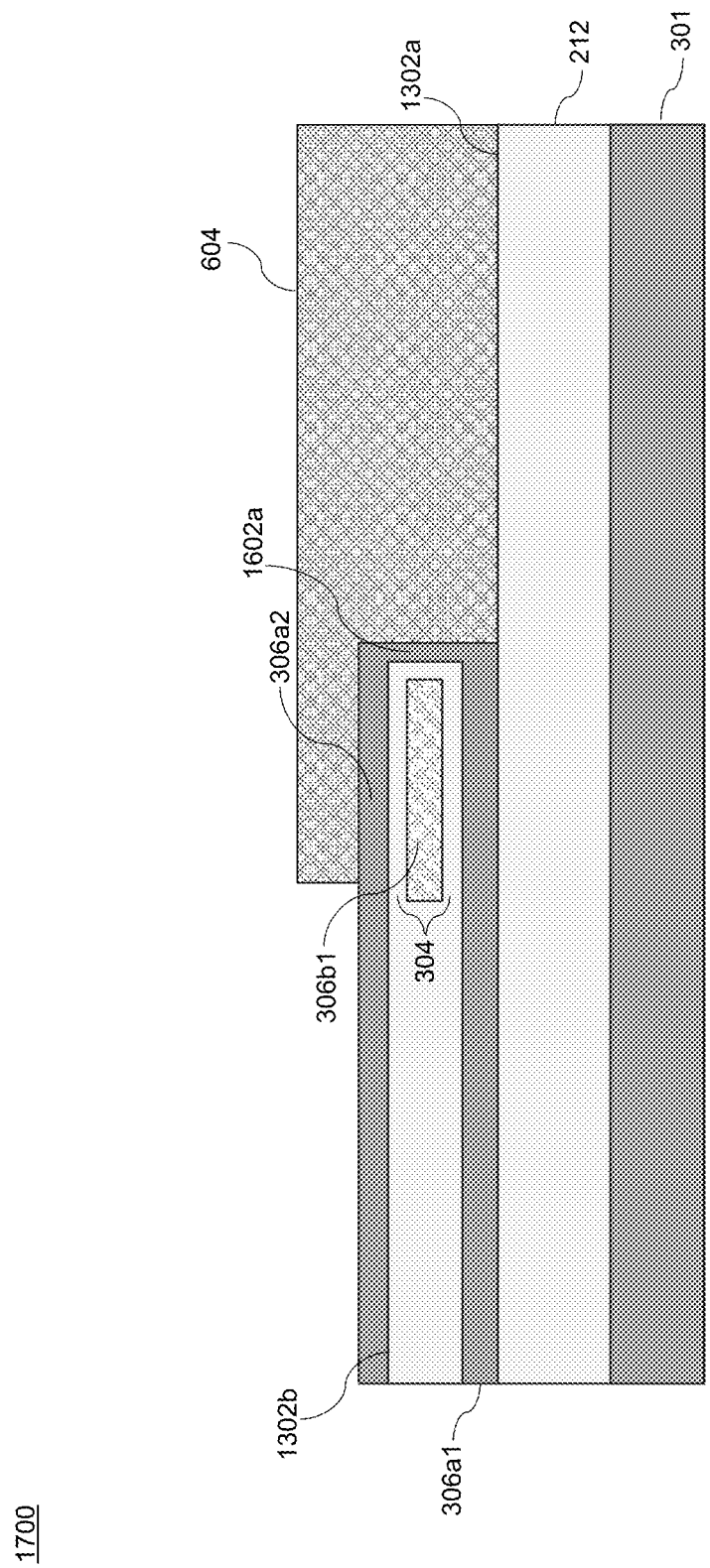
FIG. 17 is a vertical cross-sectional view of a further intermediate structure that may be used in the formation of a photonic device, according to various embodiments.

FIG. 17 is a vertical cross-sectional view of a further intermediate structure 1700 that may be used in the formation of a photonic device (300, 400), according to various embodiments. The intermediate structure 1700 may be formed from the intermediate structure 1600 of FIG. 16 by forming a patterned photoresist 604 over the intermediate structure 1600 of FIG. 16. The patterned photoresist 604 may be used as an etch mask during an etch process that may be performed to etch a portion of the second folded segment 306*a*2 of the first terminal 302*a* to be formed subsequently.

Figure 18:
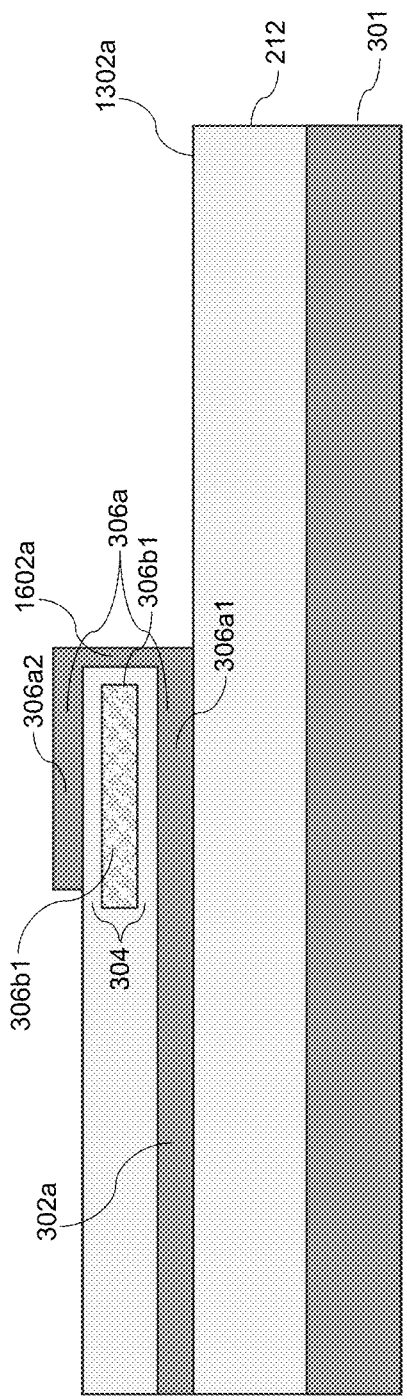
FIG. 18 is a vertical cross-sectional view of a further intermediate structure that may be used in the formation of a photonic device, according to various embodiments.

FIG. 18 is a vertical cross-sectional view of a further intermediate structure 1800 that may be used in the formation of a photonic device (300, 400), according to various embodiments. The intermediate structure 1800 may be formed from the intermediate structure 1700 of FIG. 17 by performing an anisotropic etch process to thereby reduce a width of the second folded segment 306*a*2 of the first terminal 302*a*. As shown in FIG. 18, the intermediate structure 1800 includes the completed first terminal 302*a* described above with reference to FIG. 3A. In this regard, the first terminal 302*a* is a connected structure formed of p-doped silicon having a U-shaped portion 306*a* that includes the first folded segment 306*a*1, the second folded segment 306*a*2, and the first vertical edge portion 1602*a* connecting the first folded segment 306*a*1 and the second folded segment 306*a*2. As also described above, the intermediate structure 1800 further includes the first folded segment 306*b*1 of the second terminal 302*b* to be formed subsequently.

Figure 19:
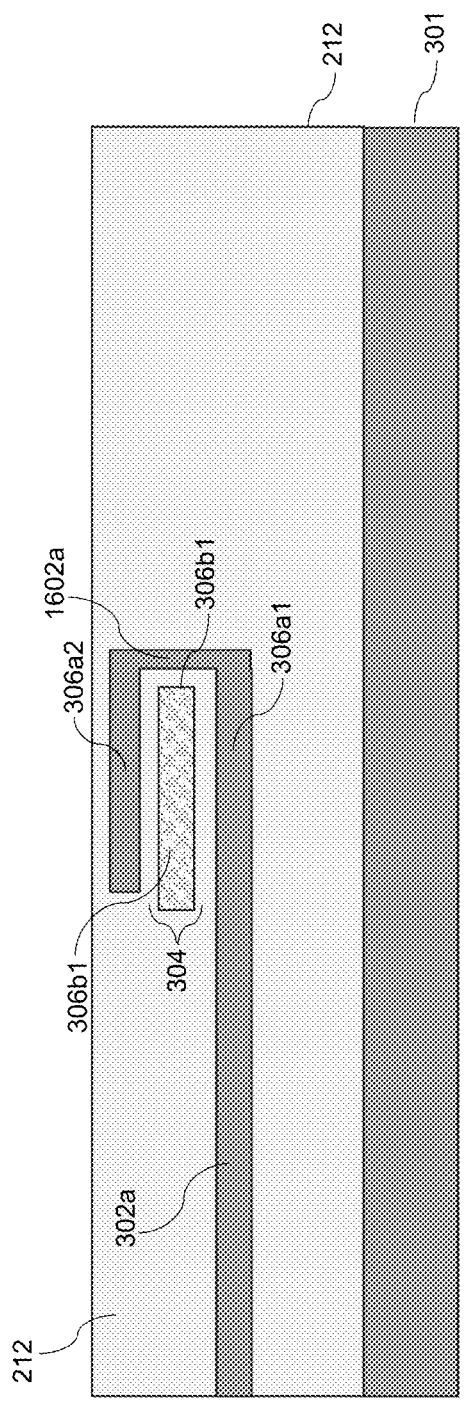
FIG. 19 is a vertical cross-sectional view of a further intermediate structure that may be used in the formation of a photonic device, according to various embodiments.

FIG. 19 is a vertical cross-sectional view of a further intermediate structure 1900 that may be used in the formation of a photonic device (300, 400), according to various embodiments. The intermediate structure 1900 may be formed from the intermediate structure 1800 of FIG. 18 by forming an additional cladding dielectric layer 212 over the intermediate structure 1800. In this regard, a blanket layer (not shown) of dielectric material may be deposited over the intermediate structure 1800 by performing a conformal deposition process such as CVD or a self-planarizing deposition process (such as spin coating). Other conformal deposition processes may include PECVD, ALD, PVD, HDPCVD processes, an MOCVD process, a sputtering process, laser ablation, etc. Excess portions of the deposited cladding dielectric layer 212 may be removed from above the top surface of the intermediate structure 1900 by a planarization process such as, for example, CMP.

Figure 20:
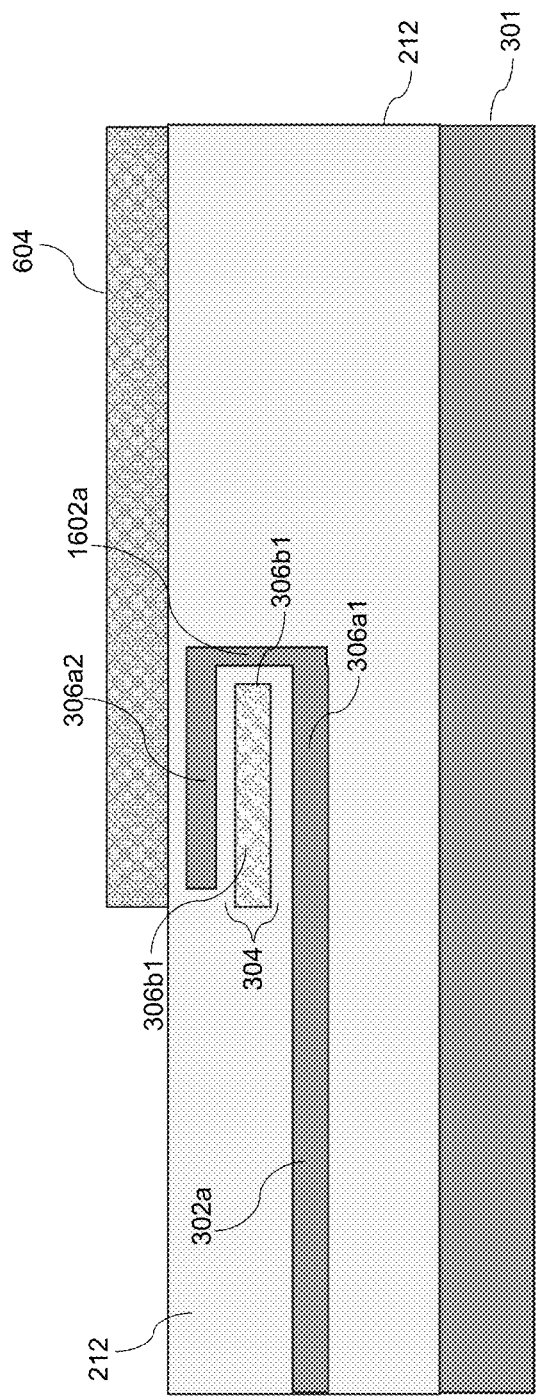
FIG. 20 is a vertical cross-sectional view of a further intermediate structure that may be used in the formation of a photonic device, according to various embodiments.

FIG. 20 is a vertical cross-sectional view of a further intermediate structure 2000 that may be used in the formation of a photonic device (300, 400), according to various embodiments. The intermediate structure 2000 may be formed from the intermediate structure 1900 of FIG. 19 by forming a patterned photoresist 604 over the intermediate structure 1900 of FIG. 19. The patterned photoresist 604 may then be used as an etch mask during a subsequent etch process that may be performed to etch the cladding dielectric layer 212.

Figure 21:
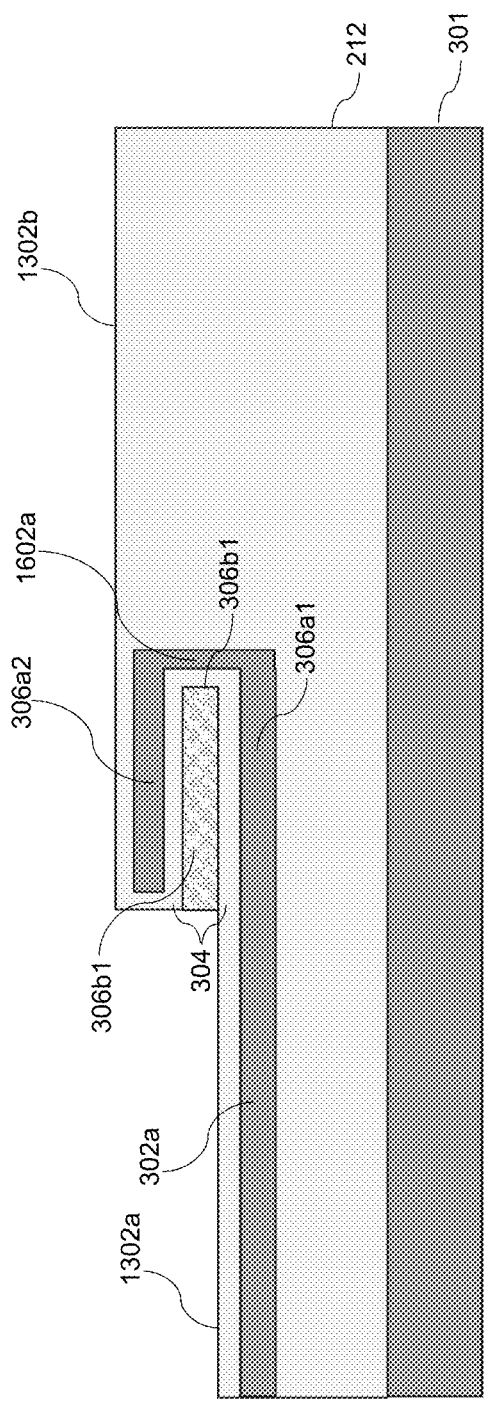
FIG. 21 is a vertical cross-sectional view of a further intermediate structure that may be used in the formation of a photonic device, according to various embodiments.

FIG. 21 is a vertical cross-sectional view of a further intermediate structure 2100 that may be used in the formation of a photonic device (300, 400), according to various embodiments. The intermediate structure 2100 may be formed from the intermediate structure 2000 of FIG. 20 by performing an anisotropic etch process to remove a portion of the cladding dielectric layer 212 that is not masked by the patterned photoresist 604. As shown in FIG. 21, the etching process may generate a stepped structure in which the cladding dielectric layer 212 has been divided into a lower portion having a first surface 1302*a* and an upper portion 212*b* having a second surface 1302*b*.

Figure 22:
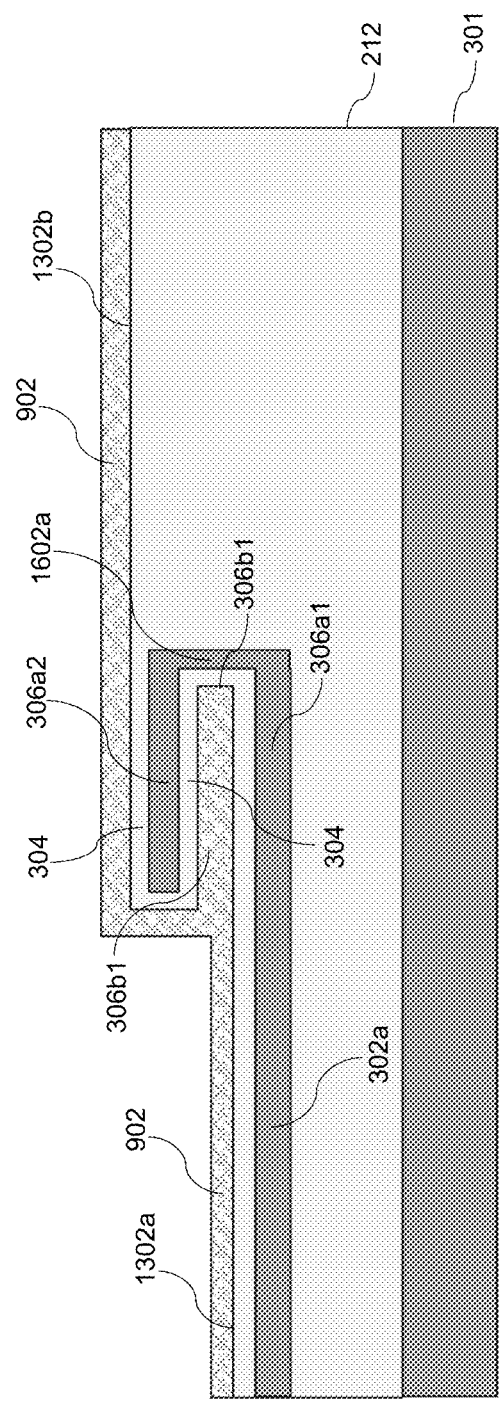
FIG. 22 is a vertical cross-sectional view of a further intermediate structure that may be used in the formation of a photonic device, according to various embodiments.

FIG. 22 is a vertical cross-sectional view of a further intermediate structure 2200 that may be used in the formation of a photonic device (300, 400), according to various embodiments. The intermediate structure 2200 may be formed from the intermediate structure 2100 of FIG. 21 by depositing a blanket layer of polysilicon 902 over the intermediate structure 2100 of FIG. 21. In this regard, the blanket layer of polysilicon 902 may be deposited using LPCVD process in which n-type dopants may be introduced using an in-situ doping process, as described in greater detail with reference to FIG. 9, above. As shown, the blanket layer of polysilicon 902 may be deposited over both the first surface 1302*a* and the second surface 1302*b*. In this way, the blanket layer of polysilicon 902 may make contact with, and may form a unified structure with, the first folded segment 306*b*1 of the second terminal 302*b* to be formed subsequently. Further, portions of the cladding dielectric layer 212 formed both above and below the second folded segment 306*a*2 of the first terminal 302*a* may serve as respective portions of the capacitor dielectric layer 304.

Figure 23:
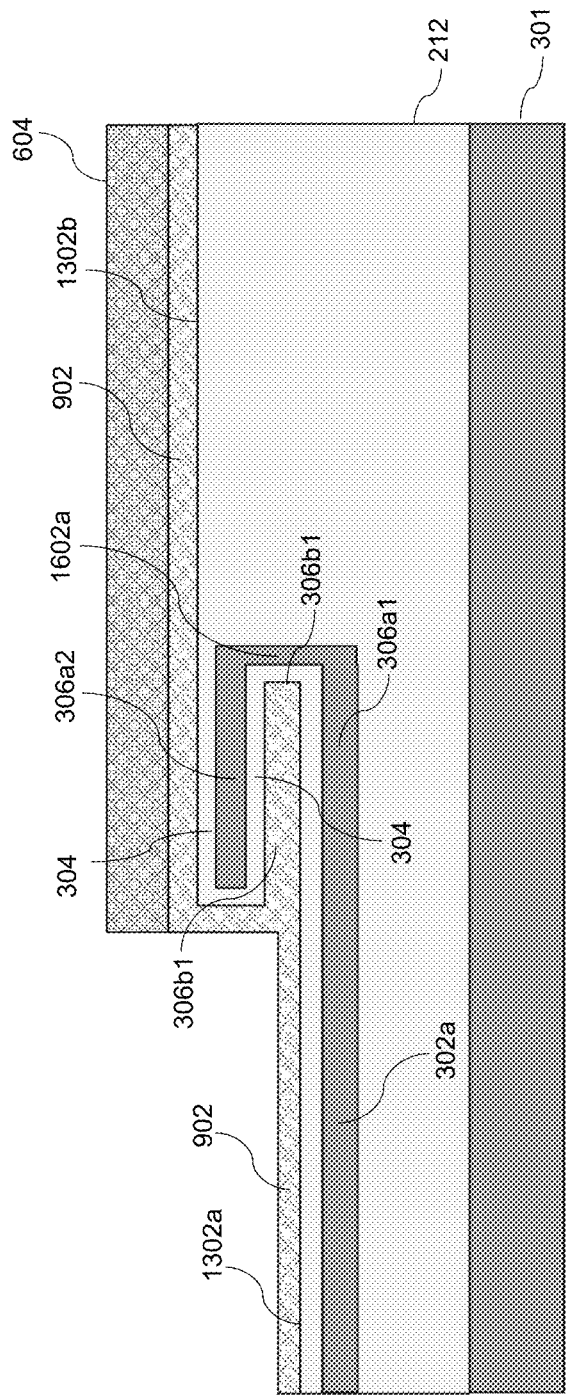
FIG. 23 is a vertical cross-sectional view of a further intermediate structure that may be used in the formation of a photonic device, according to various embodiments.

FIG. 23 is a vertical cross-sectional view of a further intermediate structure 2300 that may be used in the formation of a photonic device (300, 400), according to various embodiments. The intermediate structure 2300 may be formed from the intermediate structure 2200 of FIG. 22 by forming a patterned photoresist 604 over the intermediate structure 2200 of FIG. 22. The patterned photoresist 604 may then be used as an etch mask during a subsequent etch process that may be performed to etch the blanket layer of polysilicon 902.

Figure 24:
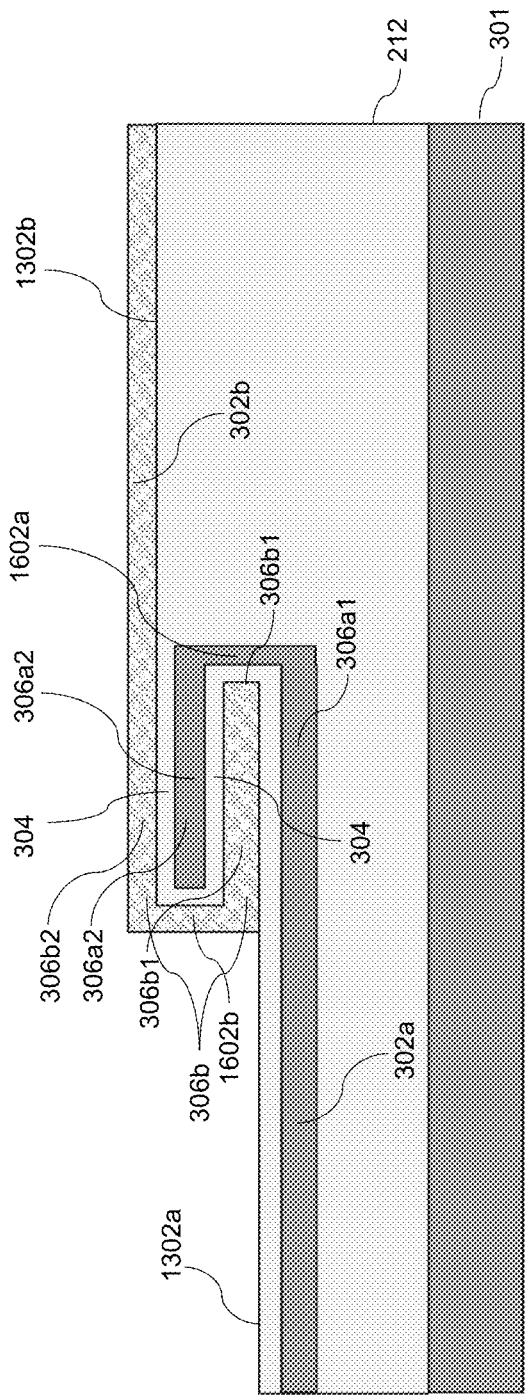
FIG. 24 is a vertical cross-sectional view of a further intermediate structure that may be used in the formation of a photonic device, according to various embodiments.

FIG. 24 is a vertical cross-sectional view of a further intermediate structure 2400 that may be used in the formation of a photonic device (300, 400), according to various embodiments. The intermediate structure 2400 may be formed from the intermediate structure 2300 of FIG. 23 by performing an anisotropic etch process to etch a portion of the blanket layer of polysilicon 902 that is not masked by the patterned photoresist 604 of FIG. 23. The patterned photoresist 604 may then be removed by ashing or by dissolution with a solvent. As shown, the remaining portion of the blanket layer of polysilicon 902 formed over the second surface 1302b may form the second folded segment 306b2 of the second terminal 302b, described above with reference to FIGS. 3B and 4B, to be formed subsequently. Further, as shown in FIG. 24, the anisotropic etch process may be performed so as to leave a second vertical edge portion 1602b of the blanket layer of polysilicon 902. In this regard, the second vertical edge portion 1602b may connect the subsequently formed layer (i.e., the second folded segment 306b2) to the previously formed layer (i.e., the first folded segment 306b1) of the second terminal 302b.

As shown in FIG. 24, the intermediate structure 2400 includes the completed second terminal 302b described above with reference to FIG. 3A. In this regard, the second terminal 302b is a connected structure formed of n-type polysilicon having a U-shaped portion 306b that includes the first folded segment 306b1, the second folded segment 306b2, and the second vertical edge portion 1602b connecting the first folded segment 306b1 and the second folded segment 306b2.

Figure 25:
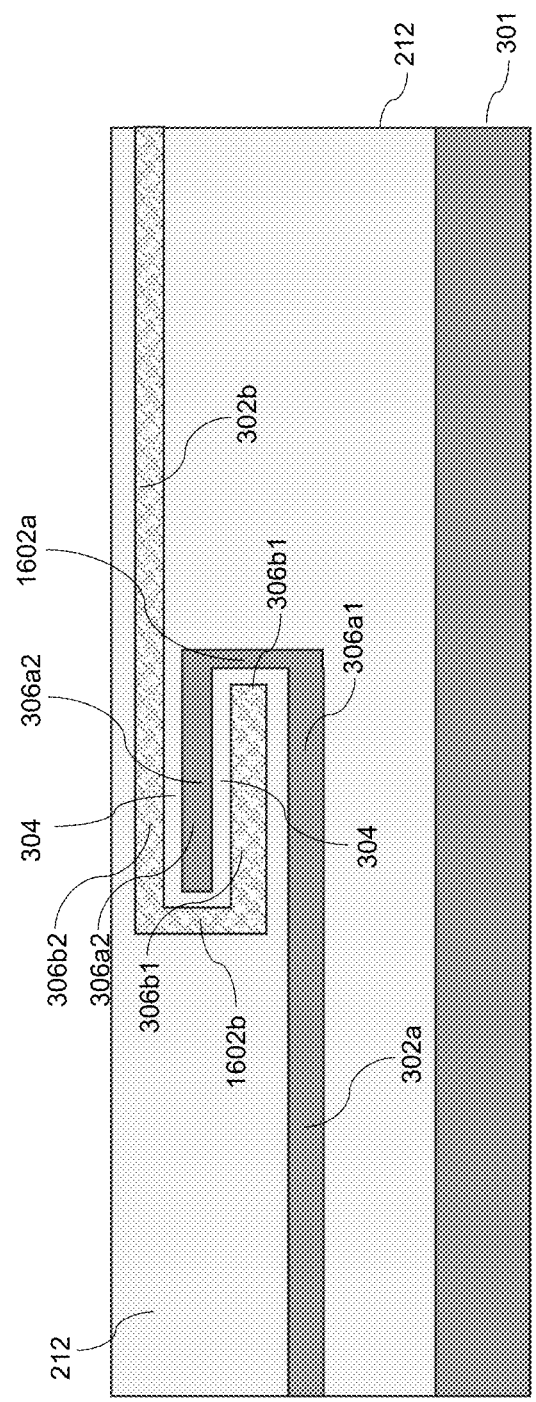
FIG. 25 is a vertical cross-sectional view of a further intermediate structure that may be used in the formation of a photonic device, according to various embodiments.

FIG. 25 is a vertical cross-sectional view of a further intermediate structure 2500 that may be used in the formation of a photonic device (300, 400), according to various embodiments. The intermediate structure 2500 may be formed from the intermediate structure 2400 of FIG. 24 by forming an additional cladding dielectric layer 212 over the intermediate structure 2400. In this regard, a blanket layer (not shown) of dielectric material may be deposited over the intermediate structure 2400 by performing a conformal deposition process such as CVD or a self-planarizing deposition process (such as spin coating). Other conformal deposition processes may include PECVD, ALD, PVD, HDPCVD processes, an MOCVD process, a sputtering process, laser ablation, etc. Excess portions of the deposited cladding dielectric layer 212 may be removed from above the top surface of the intermediate structure 2500 by a planarization process such as, for example, CMP.

Figure 26:
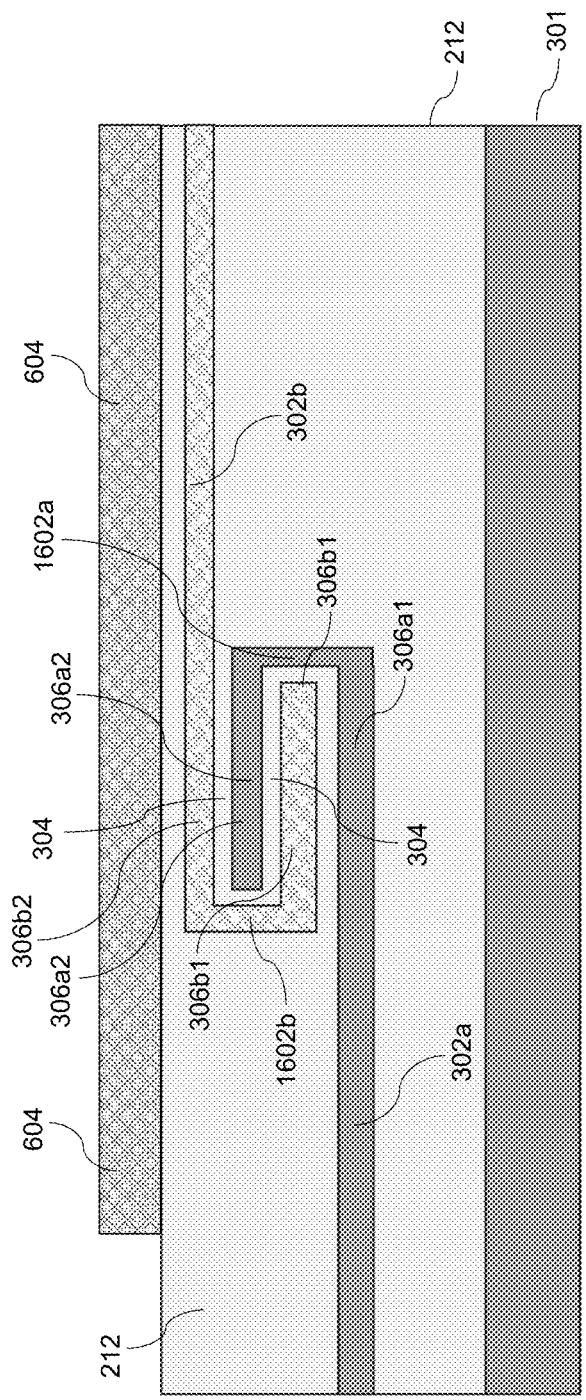
FIG. 26 is a vertical cross-sectional view of a further intermediate structure that may be used in the formation of a photonic device, according to various embodiments.

FIG. 26 is a vertical cross-sectional view of a further intermediate structure 2600 that may be used in the formation of a photonic device (300, 400), according to various embodiments. The intermediate structure 2600 may be formed from the intermediate structure 2500 of FIG. 25 by forming a patterned photoresist 604 over the intermediate structure 2500 of FIG. 25. The patterned photoresist 604 may then be used as an etch mask during a subsequent etch process that may be performed to etch the cladding dielectric layer 212.

Figure 27:
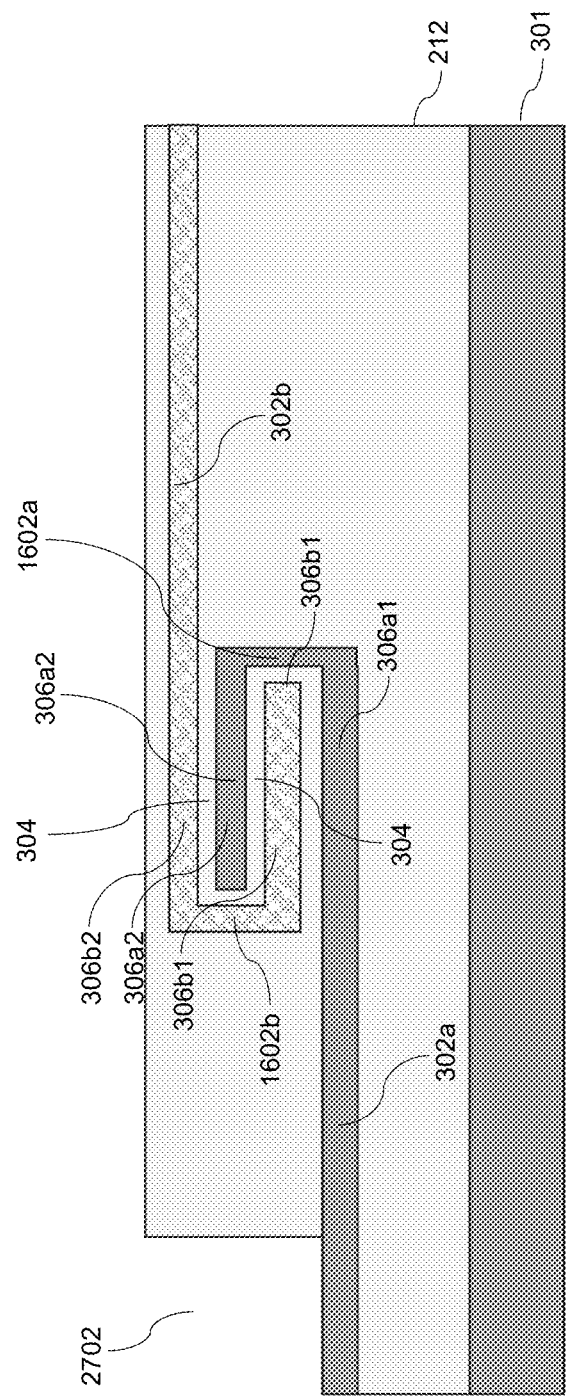
FIG. 27 is a vertical cross-sectional view of a further intermediate structure that may be used in the formation of a photonic device, according to various embodiments.

FIG. 27 is a vertical cross-sectional view of a further intermediate structure 2700 that may be used in the formation of a photonic device (300, 400), according to various embodiments. The intermediate structure 2700 may be formed from the intermediate structure 2600 of FIG. 26 by performing an anisotropic etch process selective to the silicon layer of the first terminal 302a. In this regard, the anisotropic etch process may etch the cladding dielectric layer 212 to thereby form a via hole 2702. The via hole 2702 may then be subsequently filled with p-type silicon to thereby form a contact region for the first terminal, as described in greater detail with reference to FIG. 28, below.

Figure 28:
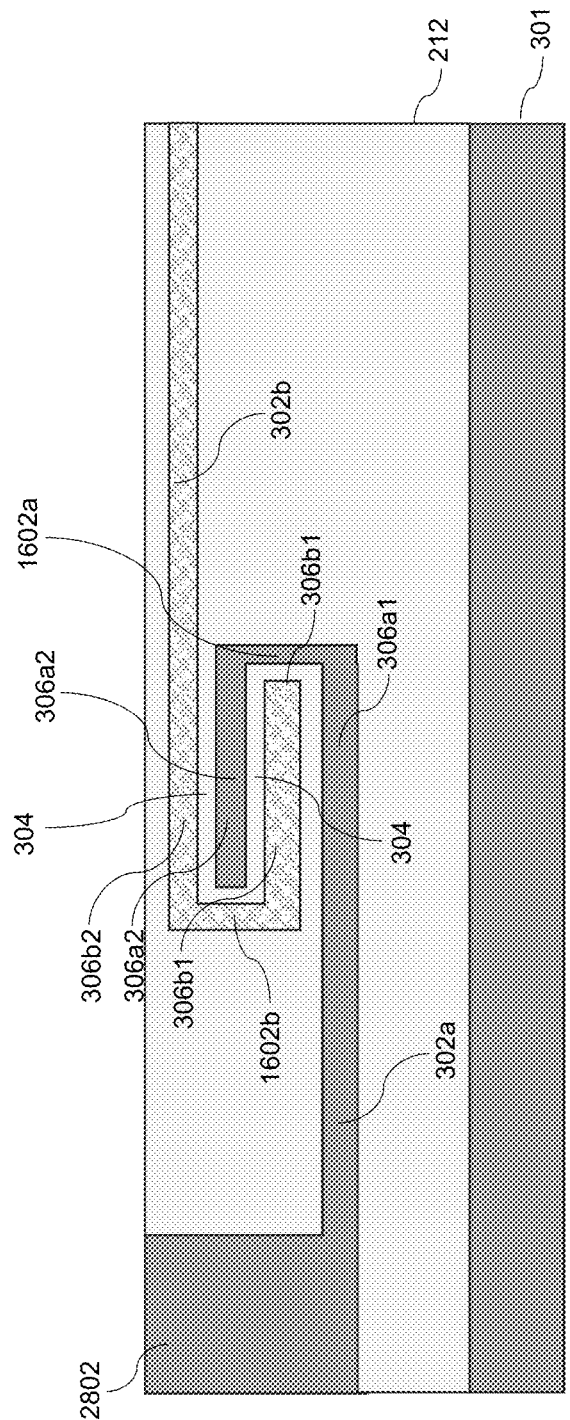
FIG. 28 is a vertical cross-sectional view of a further intermediate structure that may be used in the formation of a photonic device, according to various embodiments.

FIG. 28 is a vertical cross-sectional view of a further intermediate structure 2800 that may be used in the formation of a photonic device (300, 400), according to various embodiments. The intermediate structure 2800 may be formed from the intermediate structure 2700 of FIG. 27 by depositing a blanket layer (not shown) of silicon over the intermediate structure 2700 of FIG. 27. In this regard, the blanket layer of silicon may be deposited using CVD process in which p-type dopants may be introduced using an in-situ doping process, as described in greater detail with reference to FIG. 6, above. The blanket layer of silicon may be deposited to have a sufficient thickness to fill the via hole 2702 of FIG. 27. Excess portions of the blanket layer of silicon may then be removed by performing a planarization process such as CMP. In this way, a p-doped silicon contact region 2802 may be formed as a connected structure with the first terminal 302a.

Figure 29:
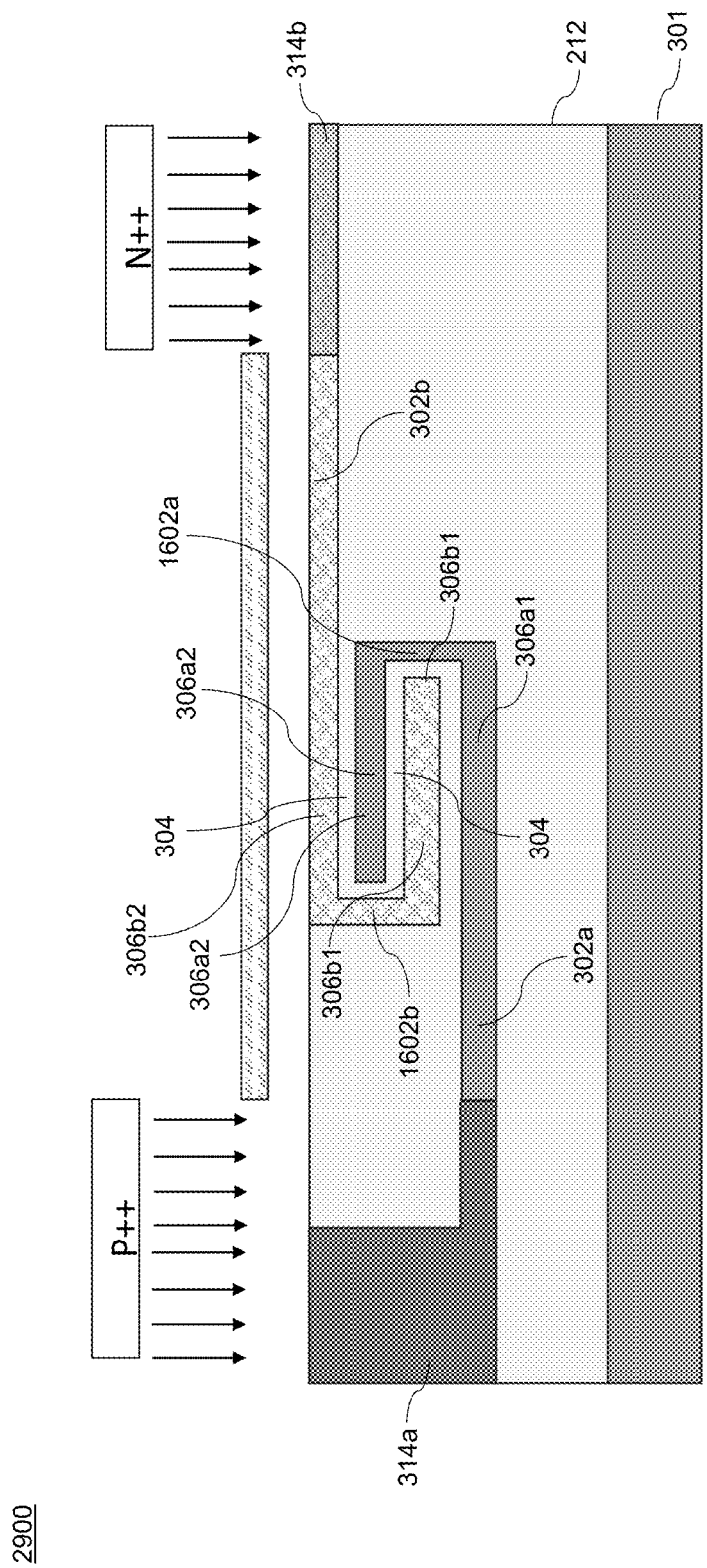
FIG. 29 is a vertical cross-sectional view of a further intermediate structure that may be used in the formation of a photonic device, according to various embodiments.

FIG. 29 is a vertical cross-sectional view of a further intermediate structure 2900 that may be used in the formation of a photonic device (300, 400), according to various embodiments. The intermediate structure 2900 may be formed from the intermediate structure 2800 of FIG. 28 by performing an ion implantation process to generate the first heavily doped semiconductor region 314a and the second heavily doped semiconductor region 314b described above with reference to FIGS. 3A and 4A. As described above, dopants in the first heavily doped semiconductor region 314a and the second heavily doped semiconductor region 314b may increase p-type and n-type carrier concentrations, which may allow ohmic contacts with the first electrode 312a and the second electrode 312b to be subsequently formed.

Figure 30:
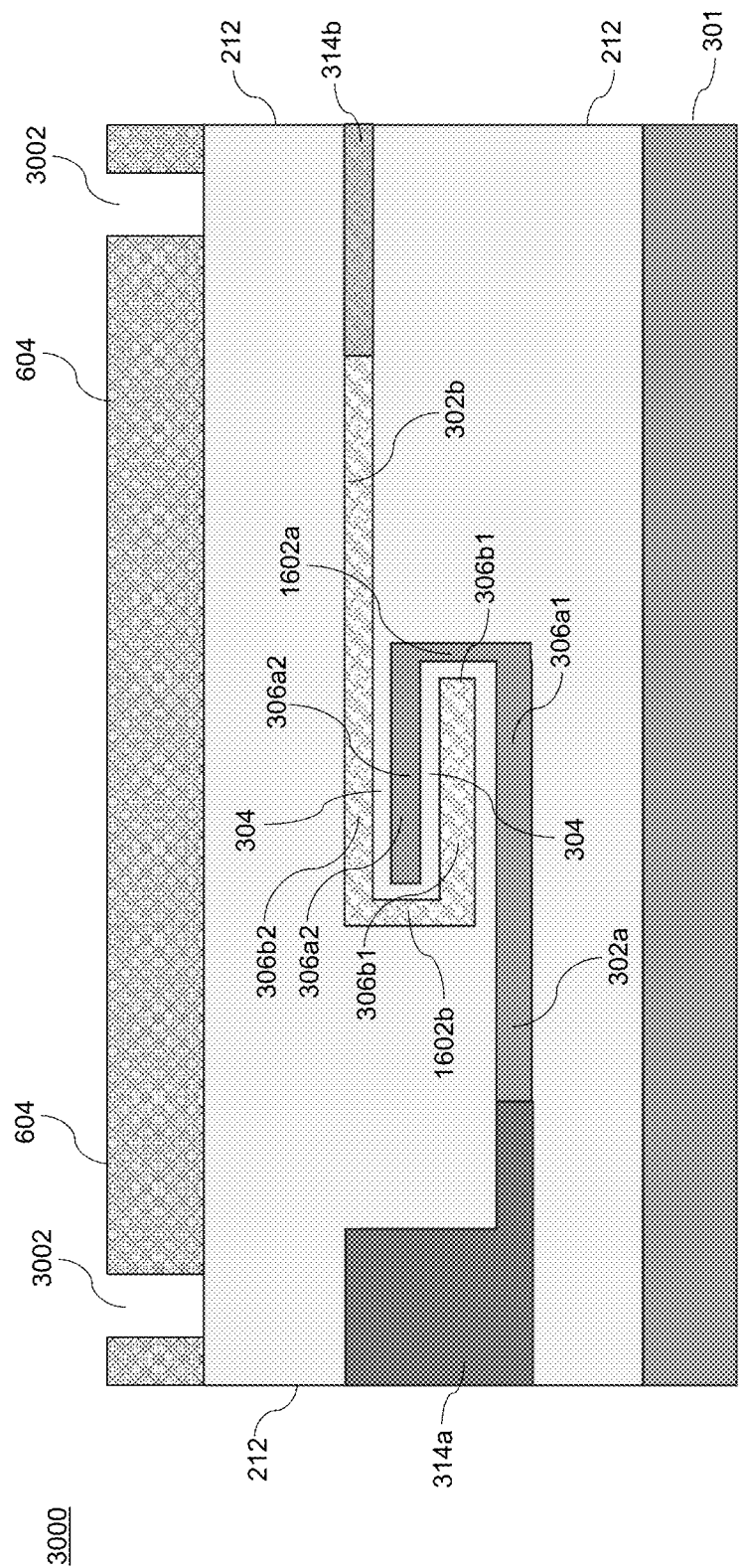
FIG. 30 is a vertical cross-sectional view of a further intermediate structure that may be used in the formation of a photonic device, according to various embodiments.
Figure 31:
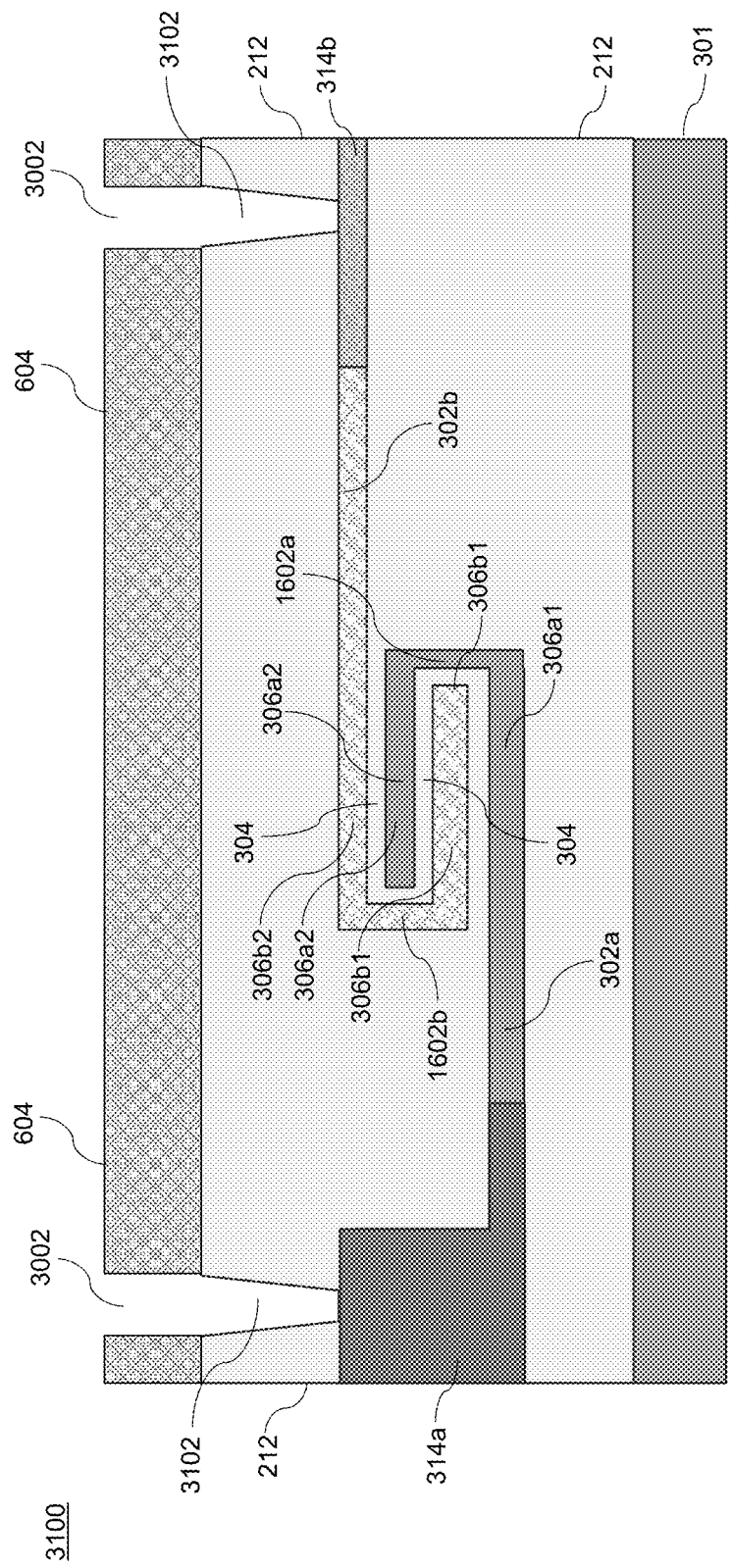
FIG. 31 is a vertical cross-sectional view of a further intermediate structure that may be used in the formation of a photonic device, according to various embodiments.
Figure 32:
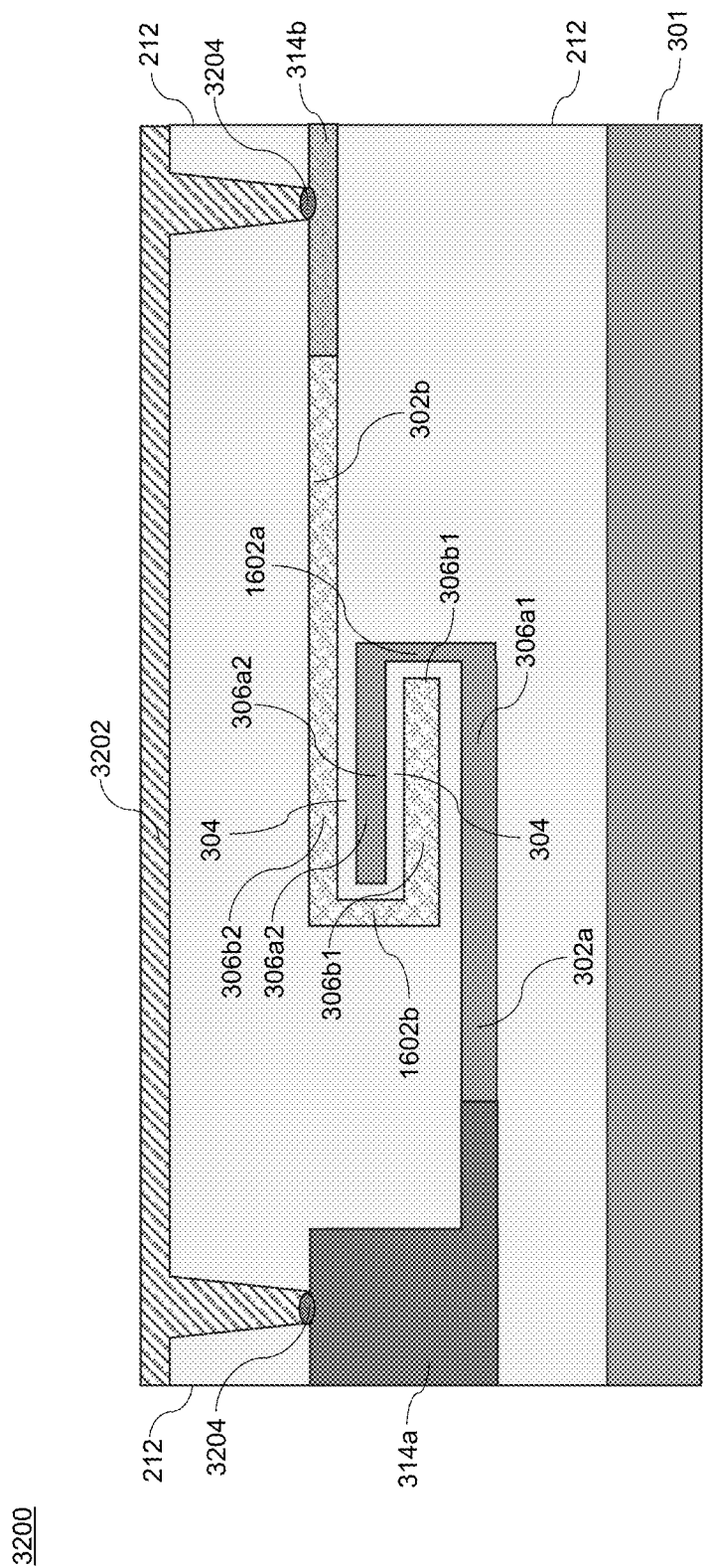
FIG. 32 is a vertical cross-sectional view of a further intermediate structure that may be used in the formation of a photonic device, according to various embodiments.

FIGS. 30 to 32 are vertical cross-sectional views of a further intermediate structures (3000, 3100, 3200) that may be used in the formation of a photonic device (300, 400), according to various embodiments. The intermediate structure 3000 may be formed from the intermediate structure 2900 of FIG. 29 by deposition of an additional layer of the cladding dielectric layer 212, according to methods described in greater detail above, followed by formation of a patterned photoresist 604 over the resulting structure. As shown, the patterned photoresist 604 may include openings 3002 that may allow the cladding dielectric layer 212 to be etched to form via holes 3102 as shown in FIG. 31. The via holes 3102 may then be filled with a conductive material 3202 (e.g., see FIG. 32) to thereby form the first electrode 312a and the second electrode 312b.

The conductive material 3202 may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable conductive materials within the contemplated scope of this disclosure may also be used.

Prior to the introduction of the conductive material 3202, self-aligned silicides (i.e., salicides) 3204 may be formed over the first terminal 302a and the second terminal 302b. The salicides 3204 may be formed by introducing metal ions (e.g., Ni, Ti, Co, Hf, Mn, Pd, Pt, Ta, W, Zr) into the via holes 3102. The metal ions may be introduced using a process of evaporation, sputtering, or CVD processes so that the metal ions may interact with the silicon of the first terminal 302a and the polysilicon of the second terminal 302b. After the introduction of metal ions, the intermediate structure 3100 may be subjected to a rapid thermal anneal (RTA) process to thereby form the salicides 3204. The salicides 3204 may include various silicon/metal compounds such as $CoSi_2$, $HfSi_2$, $MoSi_2$, $NiSi_2$, $Pd_2Si$, $PtSi$, $TaSi_2$, $TiSi_2$, $WSi_2$, $ZrSi_2$, etc.

As shown in FIG. 32, the conductive material 3202 may be deposited so that direct contact between the conductive material 3202 and the salicides 3204 may be formed. As such, good electrical connections (i.e., ohmic contacts) may be formed between the conductive material 3202 and the first terminal 302a and the second terminal 302b. Excess conductive material 3202 may then be removed over a top surface of the cladding dielectric layer 212 to thereby form the photonic device 300 of FIGS. 3A and 3B. The photonic device 400 of FIGS. 4A and 4B may be formed by performing processes similar to those described above with reference to FIGS. 5 to 32, as summarized with reference to FIG. 33, below.

Figure 33:
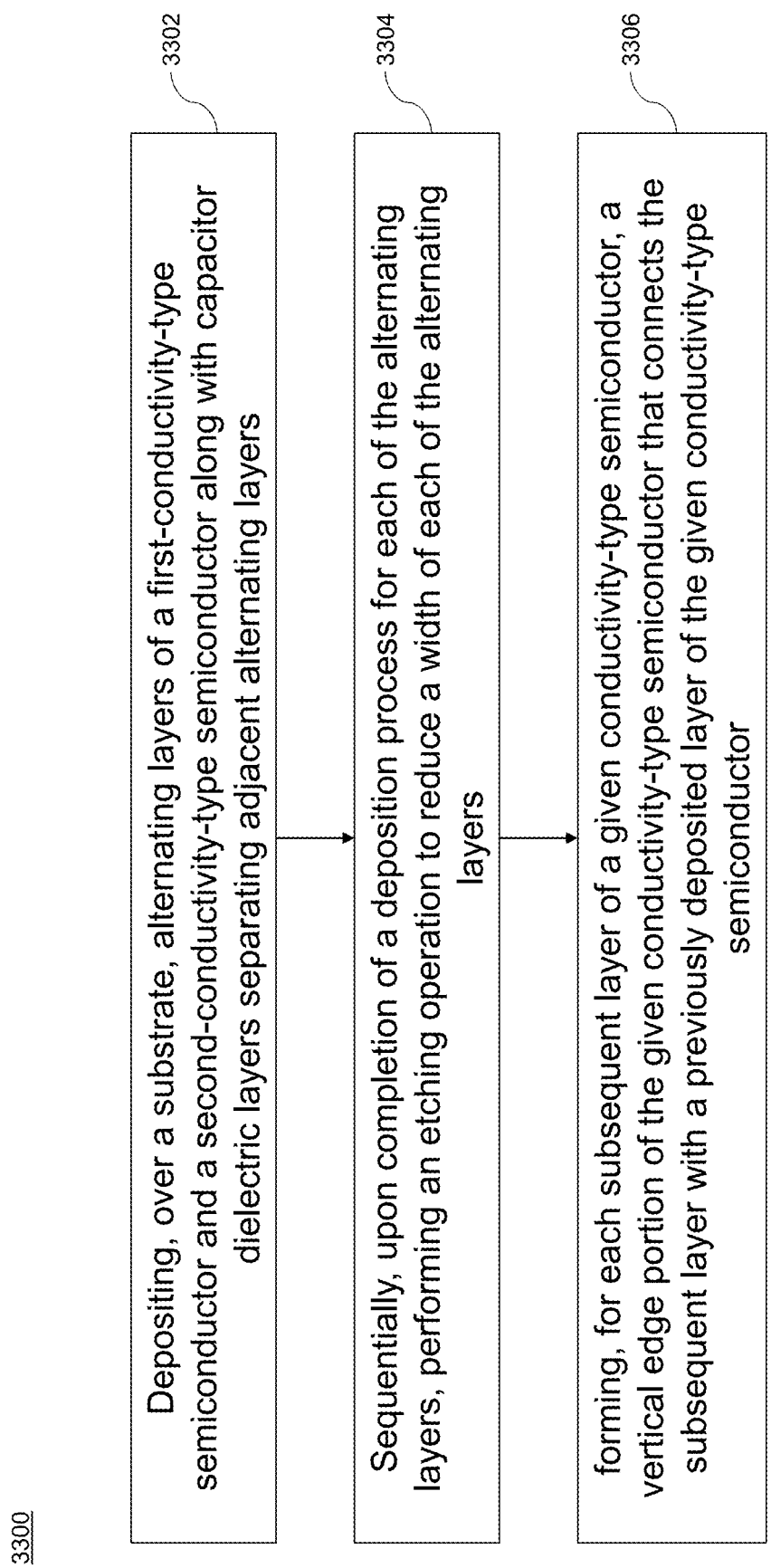
FIG. 33 is a flowchart illustrating operations of a method of forming a photonic device, according to various embodiments.

FIG. 33 is a flowchart illustrating operations of a method 3300 of forming a photonic device (300, 400), according to various embodiments. In operation 3302, the method 3300 may include depositing, over a substrate 301, alternating layers (306a1, 306b1, 306a2, 306b2) of a first-conductivity-type semiconductor 602 and a second-conductivity-type semiconductor 902 along with capacitor dielectric layers 304 separating adjacent alternating layers (306a1, 306b1, 306a2, 306b2). In operation 3304, the method 3300 may include sequentially, upon completion of a deposition process for each of the alternating layers (306a1, 306b1, 306a2, 306b2), performing an etching operation to reduce a width of each of the alternating layers (306a1, 306b1, 306a2, 306b2). In operation 3306, the method 3300 may include forming, for each subsequent layer (306a2, 306b2) of a given conductivity-type semiconductor (602, 902), a vertical edge portion (1602a, 1602b) of the given conductivity-type semiconductor (602, 902) that connects the subsequent layer (306a2, 306b2) with a previously deposited layer (306a1, 306b1) of the given conductivity-type semiconductor (602, 902).

In this regard, a plurality of connected first-conductivity-type semiconductor 602 layers (306a1, 306a2) forms a first terminal 302a having a first overlapping portion 306a in a first cross-sectional plane (i.e., the x-z plane) perpendicular to a first direction (i.e., the y-axis), and a plurality of connected second-conductivity-type semiconductor 902 layers (306b1, 306b2) forms a second terminal 302b having a second overlapping portion 306b in the first cross-sectional plane (i.e., the x-z plane). Further, the method 3300 may further include forming the first overlapping portion 306a and the second overlapping portion 306b to be arranged in an interlocking configuration (e.g., see FIGS. 3A and 4A) including an overlapping region 308 such that, in the overlapping region 308, the first terminal 302a and the second terminal 302b are further overlapping in a second cross-sectional plane (i.e., the y-z plane) that is perpendicular to the first cross-sectional plane (i.e., the x-z plane).

In depositing the alternating layers (306a1, 306b1, 306a2, 306b2) of the first-conductivity-type semiconductor 602 and the second-conductivity-type semiconductor 902 and sequentially performing the etching operation according to operations 3302 and 3304, the method 3300 may further include forming the first terminal 302a and the second terminal 302b such that each of the first overlapping portion 306a and the second overlapping portion 306b are folded an integer number (m) of times such that the overlapping region 308 may include an alternating stack of m+1 first folded segments (306a1, 306a2, 306a3) of the first terminal 302a and m+1 second folded segments (306b1, 306b2, 306b3) of the second terminal 302b, wherein m is greater than or equal to 1 (e.g., see FIGS. 3A and 3B for an embodiment with m=1 and FIGS. 4A and 4B for an embodiment with m=2). The method 3300 may further include configuring the overlapping region 308 as an optical transmission line 309 in which the first direction (i.e., the y-axis) is an optical propagation direction.

In depositing the alternating layers (306a1, 306b1, 306a2, 306b2) of the first-conductivity-type semiconductor 602 and the second-conductivity-type semiconductor 902 according to operation 3302, the method 3300 may further include performing the deposition process for each of the alternating layers (306a1, 306b1, 306a2, 306b2) as an in-situ doping process such that deposition of the first-conductivity-type semiconductor 602 may further include deposition of first-conductivity-type dopants and deposition of the second-conductivity-type semiconductor 902 may further include deposition of second-conductivity-type dopants. Further, in depositing the alternating layers (306a1, 306b1, 306a2, 306b2) of the first-conductivity-type semiconductor 602 and the second-conductivity-type semiconductor 902 according to operation 3302, the method 3300 may further include depositing the first-conductivity-type semiconductor 602 as p-type silicon and depositing the second-conductivity-type semiconductor 902 as n-type polysilicon.

Referring to all drawings and according to various embodiments of the present disclosure, a photonic device (300, 400) is provided. The photonic device (300, 400) may include a first terminal 302a including silicon and a second terminal 302b including polysilicon. The first terminal 302a may be configured as a first three-dimensional structure extending along a first direction (i.e., the y-axis) and having a first U-shaped portion 306a in a first cross-sectional plane (i.e., the x-z plane) perpendicular to the first direction (i.e., the y-axis). Similarly, the second terminal 302b may be configured as a second three-dimensional structure extending along the first direction (i.e., the y-axis) and having a second U-shaped portion 306b in the first cross-sectional plane (i.e., the x-z plane). The photonic device (300, 400) may further include a capacitor dielectric layer 304 disposed between the first terminal 302a and the second terminal 302b and a cladding dielectric layer 212 surrounding the first terminal 302a and the second terminal 302b.

The first U-shaped portion 306a and the second U-shaped portion 306b may be arranged in an interlocking configuration (e.g., see FIGS. 3A and 4A) including an overlapping region 308 such that, in the overlapping region 308, that the first terminal 302a and the second terminal 302b are further overlapping in a second cross-sectional plane (i.e., the y-z plane) that is perpendicular to the first cross-sectional plane (i.e., the x-z plane). Further, the overlapping region 308 may be configured as an optical transmission line 309 in which the first direction (i.e., the y-axis) is an optical propagation direction.

According to various embodiments, the optical transmission line 309 may include a first effective index of refraction $n_1$ in response to application of a first potential difference between the first terminal 302a and the second terminal 302b and may include a second effective index of refraction $n_2$ in response to application of a second potential difference between the first terminal 302a and the second terminal 302b. In various embodiments, the silicon of the first terminal 302a may further include a p-type doping and the polysilicon of the second terminal 302b may further include an n-type doping.

According to some embodiments, each of the first terminal 302a, the second terminal 302b, and the capacitor dielectric layer 304 may have a length 316 along the optical propagation direction that is in a range from approximately 150 microns to approximately 300 microns. In some embodiments, the optical transmission line 309 may have a width 318 in the first cross-sectional plane (i.e., the x-z plane) that is between 400 nm and 500 nm, and the optical transmission line 309 may have a thickness 320 in the first cross-sectional plane (i.e., the x-z plane) that is between 150 nm and 250 nm. In various embodiments, the first terminal 302a and the second terminal 302b may each include connected layers (306a1, 306a2, 306a3, 306b1, 306b2, 3063) having a thicknesses (322a, 322b) that are between 50 nm and 80 nm. The optical transmission line 309 may be configured to support an optical mode having an electric field distribution 310 in the first cross-sectional plane (i.e., the x-z plane) that spatially overlaps with the first terminal 302a and the second terminal 302b. The photonic device (300, 400) may have a voltage times length product Vπ·Lπ, which characterizes a 180° phase shift of an optical mode propagating in the optical transmission line 309, which is less than 0.1 V-cm.

In various embodiments, the optical transmission line 309 may have an optical insertion loss of less than 0.5 dB relative to a silicon waveguide structure 200c. In some embodiments, the capacitor dielectric layer 304 may have a thickness 324 that is in a range from approximately 2 nm to 7 nm. Further, in some embodiments, the first terminal 302a, the second terminal 302b, and the capacitor dielectric layer 304 may be configured as a semiconductor-insulator-semiconductor capacitor including a capacitance per unit length in the optical propagation direction (i.e., the y-axis) that is in a range from approximately 1 fF/micron to approximately 20 fF/micron in response to an applied potential difference between the first terminal 302a and the second terminal 302b that is between 0 V and 6 V.

A further embodiment photonic device (300, 400) may include a first terminal 302a having a p-type semiconductor and a second terminal 302b including an n-type semiconductor. The first terminal 302a may be configured as a first three-dimensional structure extending along a first direction (i.e., the y-axis) and having a first overlapping portion in a first cross-sectional plane (i.e., the x-z plane) perpendicular to the first direction (i.e., the y-axis). Similarly, the second terminal 302b is a second three-dimensional structure extending along the first direction (i.e., the y-axis) and having a second overlapping portion in the first cross-sectional plane (i.e., the x-z plane) perpendicular to the first direction (i.e., the y-axis). The photonic device (300, 400) may further include a capacitor dielectric layer 304 disposed between the first terminal 302a and the second terminal 302b and a cladding dielectric layer 212 surrounding the first terminal 302a and the second terminal 302b. The first overlapping portion 306a and the second overlapping portion 306b may be arranged in an interlocking configuration (e.g., see FIGS. 3A and 4A) including an overlapping region 308 such that, in the overlapping region 308, the first terminal 302a and the second terminal 302b are further overlapping in a second cross-sectional plane (i.e., the y-z plane) that is perpendicular to the first cross-sectional plane (i.e., the x-z plane).

According to various embodiments, each of the first overlapping portion 306a and the second overlapping portion 306b may be folded an integer number (m) of times such that the overlapping region 308 may include an alternating stack of m+1 first folded segments (306a1, 306a2, 306a3) of the first terminal 302a and m+1 second folded segments (306b1, 306b2, 306b3) of the second terminal 302b, such that m is greater than or equal to 1 (e.g., m=1 in FIGS. 3A and 3B and m=2 in FIGS. 4A and 4B). The overlapping region 308 may further be configured as an optical transmission line 309 in which the first direction (i.e., the y-axis) is an optical propagation direction.

In various embodiments, the optical transmission line 309 may support an optical mode having an electric field distribution 310 in the first cross-sectional plane (i.e., the x-z plane) that spatially overlaps with each of the m+1 first folded segments (306a1, 306a2, 306a3) of the first terminal 302a and with each of the m+1 second folded segments (306b1, 306b2, 306b3) of the second terminal 302b. In certain embodiments, the integer m may be greater than or equal to 2. In some embodiments, the first terminal 302a may further include p-type silicon and the second terminal 302b may further include n-type polysilicon. Further, in some embodiments, the photonic device (300, 400) may have a voltage times length product Vπ·Lπ (which characterizes a 180° phase shift of an optical mode propagating in the optical transmission line 309) that is less than 0.1 V-cm.

Disclosed embodiments may provide advantages over existing modulators by generating larger optical phase shifts for a given applied voltage and by having reduced optical insertion loss relative to existing modulators. In this regard, embodiment optical modulators include a first terminal 302a and second terminal 302b having an interlocking configuration that includes a stacked structure including alternating connected layers (306a1, 306b1, 306a2, 306b2) of the first terminal 302a and the second terminal 302b. The stacked structure effectively improves modulation efficiency due to an increased overlap of an optical mode electric field distribution 310 with charge carriers of the first terminal 302a and the second terminal 302b leading to sub-1V phase modulation and insertion loss of less than 0.5 dB relative to a silicon waveguide structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A photonic device, comprising:
a first terminal comprising silicon, wherein the first terminal is a first three-dimensional structure extending along a first direction and having a first U-shaped portion in a first cross-sectional plane perpendicular to the first direction;
a second terminal comprising polysilicon, wherein the second terminal is a second three-dimensional structure extending along the first direction and having a second U-shaped portion in the first cross-sectional plane;
a capacitor dielectric layer disposed between the first terminal and the second terminal; and
a cladding dielectric layer surrounding the first terminal and the second terminal,
wherein the first U-shaped portion and the second U-shaped portion are arranged in an interlocking configuration comprising an overlapping region such that, in the overlapping region, the first terminal and the second terminal are further overlapping in a second cross-sectional plane that is perpendicular to the first cross-sectional plane, and
wherein the overlapping region is configured as an optical transmission line in which the first direction is an optical propagation direction.

2. The photonic device of claim 1, wherein the optical transmission line comprises a first effective index of refraction in response to application of a first potential difference between the first terminal and the second terminal, and
wherein the optical transmission line comprises a second effective index of refraction in response to application of a second potential difference between the first terminal and the second terminal.

3. The photonic device of claim 1, wherein:
the silicon of the first terminal further comprises a p-type doping; and
the polysilicon of the second terminal further comprises an n-type doping.

4. The photonic device of claim 1, wherein each of the first terminal, the second terminal, and the capacitor dielectric layer comprise a length along the optical propagation direction that is in a range from approximately 150 microns to approximately 300 microns.

5. The photonic device of claim 1, wherein:
the optical transmission line comprises a width in the first cross-sectional plane that is between 400 nm and 500 nm; and
the optical transmission line comprises a thickness in the first cross-sectional plane that is between 150 nm and 250 nm.

6. The photonic device of claim 1, wherein the first terminal and the second terminal each comprise connected layers each comprising a thickness that is between 50 nm and 80 nm.

7. The photonic device of claim 1, wherein the optical transmission line supports an optical mode having an electric field distribution in the first cross-sectional plane that spatially overlaps with the first terminal and the second terminal.

8. The photonic device of claim 1, further comprising a voltage times length product Vπ·Lπ, which characterizes a 180° phase shift of an optical mode propagating in the optical transmission line, wherein the voltage times length product Vπ·Lπ is less than 0.1 V-cm.

9. The photonic device of claim 1, wherein the optical transmission line comprises an optical insertion loss of less than 0.5 dB relative to a silicon waveguide structure.

10. The photonic device of claim 1, wherein the capacitor dielectric layer comprises a thickness that is in a range from approximately 2 nm to 7 nm.

11. The photonic device of claim 1, wherein the first terminal, the second terminal, and the capacitor dielectric layer are configured as a semiconductor-insulator-semiconductor capacitor comprising a capacitance per unit length in the optical propagation direction that is in a range from approximately 1 fF/micron to approximately 20 fF/micron in response to an applied potential difference between the first terminal and the second terminal that is between 0 V and 6 V.

12. A photonic device, comprising:
a first terminal comprising a p-type semiconductor, wherein the first terminal is a first three-dimensional structure extending along a first direction and having a first overlapping portion in a first cross-sectional plane perpendicular to the first direction;
a second terminal comprising an n-type semiconductor, wherein the second terminal is a second three-dimensional structure extending along the first direction and having a second overlapping portion in the first cross-sectional plane perpendicular to the first direction;
a capacitor dielectric layer disposed between the first terminal and the second terminal; and
a cladding dielectric layer surrounding the first terminal and the second terminal,
wherein the first overlapping portion and the second overlapping portion are arranged in an interlocking configuration comprising an overlapping region such that, in the overlapping region, the first terminal and the second terminal are further overlapping in a second cross-sectional plane that is perpendicular to the first cross-sectional plane,
wherein each of the first overlapping portion and the second overlapping portion are folded an integer number (m) of times such that the overlapping region comprises an alternating stack of m+1 first folded segments of the first terminal and m+1 second folded segments of the second terminal, wherein m is greater than or equal to 1, and
wherein the overlapping region is configured as an optical transmission line in which the first direction is an optical propagation direction.

13. The photonic device of claim 12, wherein the optical transmission line supports an optical mode having an electric field distribution in the first cross-sectional plane that spatially overlaps with each of the m+1 first folded segments of the first terminal and with each of the m+1 second folded segments of the second terminal.

14. The photonic device of claim 12, wherein m is greater than or equal to 2.

15. The photonic device of claim 12, wherein:
the first terminal further comprises p-type silicon; and
the second terminal further comprises n-type polysilicon.

16. The photonic device of claim 12, further comprising:
a voltage times length product Vπ·Lπ, which characterizes a 180° phase shift of an optical mode propagating in the optical transmission line, which is less than 0.1 V-cm; and
an optical insertion loss of less than 0.5 dB relative to a silicon waveguide structure.

17. A method of forming a photonic device, comprising:
depositing, over a substrate, alternating layers of a first-conductivity-type semiconductor and a second-conductivity-type semiconductor along with capacitor dielectric layers separating adjacent alternating layers;
sequentially, upon completion of a deposition process for each of the alternating layers, performing an etching operation to reduce a width of each of the alternating layers; and
forming, for each subsequent layer of a given conductivity-type semiconductor, a vertical edge portion of the given conductivity-type semiconductor that connects the subsequent layer with a previously deposited layer of the given conductivity-type semiconductor,
wherein a plurality of connected first-conductivity-type semiconductor layers forms a first terminal having a first overlapping portion in a first cross-sectional plane perpendicular to a first direction,
wherein a plurality of connected second-conductivity-type semiconductor layers forms a second terminal having a second overlapping portion in the first cross-sectional plane, and
wherein the first overlapping portion and the second overlapping portion are arranged in an interlocking configuration comprising an overlapping region such that, in the overlapping region, the first terminal and the second terminal are further overlapping in a second cross-sectional plane that is perpendicular to the first cross-sectional plane.

18. The method of claim 17, wherein depositing the alternating layers of the first-conductivity-type semiconductor and the second-conductivity-type semiconductor and sequentially performing the etching operation further comprises:

forming the first terminal and the second terminal such that each of the first overlapping portion and the second overlapping portion are folded an integer number (m) of times such that the overlapping region comprises an alternating stack of m+1 first folded segments of the first terminal and m+1 second folded segments of the second terminal, wherein m is greater than or equal to 1, and configuring the overlapping region as an optical transmission line in which the first direction is an optical propagation direction.

19. The method of claim 17, wherein depositing the alternating layers of the first-conductivity-type semiconductor and the second-conductivity-type semiconductor further comprises:

performing the deposition process for each of the alternating layers as an in-situ doping process such that deposition of the first-conductivity-type semiconductor further comprises deposition of first-conductivity-type dopants and deposition of the second-conductivity-type semiconductor further comprises deposition of second-conductivity-type dopants.

20. The method of claim 17, wherein depositing the alternating layers of the first-conductivity-type semiconductor and the second-conductivity-type semiconductor further comprises:

depositing the first-conductivity-type semiconductor as p-type silicon; and depositing the second-conductivity-type semiconductor as n-type polysilicon.

* * * * *